(12) United States Patent
Fukae

(10) Patent No.: US 11,342,125 B2
(45) Date of Patent: May 24, 2022

(54) CHIP COMPONENT

(71) Applicant: ROHM CO., LTD., Kyoto (JP)

(72) Inventor: Keisuke Fukae, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/985,016

(22) Filed: Aug. 4, 2020

(65) Prior Publication Data

US 2021/0043387 A1 Feb. 11, 2021

(30) Foreign Application Priority Data

Aug. 9, 2019 (JP) .............................. JP2019-147478
Apr. 24, 2020 (JP) .............................. JP2020-077712

(51) Int. Cl.
  *H01G 4/33* (2006.01)
  *H01G 4/30* (2006.01)
  *H01G 4/252* (2006.01)
  *H01G 4/012* (2006.01)
  *H01G 4/008* (2006.01)

(52) U.S. Cl.
  CPC ............. *H01G 4/33* (2013.01); *H01G 4/012* (2013.01); *H01G 4/252* (2013.01); *H01G 4/306* (2013.01); *H01G 4/008* (2013.01)

(58) Field of Classification Search
  CPC .......... H01G 4/33; H01G 4/012; H01G 4/085; H01G 4/1209; H01G 4/1236; H01G 4/1272; H01G 4/2325; H01G 4/248; H01G 4/306; H01G 4/30; H01G 4/005; H01G 4/018; H01G 4/252; H01G 4/008; H01L 28/87; H01L 28/91; H01L 28/60
  See application file for complete search history.

(56) References Cited

U.S. PATENT DOCUMENTS

| | | | |
|---|---|---|---|
| 2009/0310278 A1* | 12/2009 | Tani | H01G 4/232 361/306.3 |
| 2010/0230787 A1 | 9/2010 | Guiraud et al. | |
| 2016/0268273 A1* | 9/2016 | Nakao | H01L 27/11502 |
| 2017/0104057 A1* | 4/2017 | Voiron | H01L 28/91 |
| 2017/0309404 A1* | 10/2017 | Watanabe | H01G 4/33 |
| 2017/0330688 A1* | 11/2017 | Lim | H01G 4/232 |

FOREIGN PATENT DOCUMENTS

| | | |
|---|---|---|
| JP | 2013-141003 A | 7/2013 |
| JP | 2017-195322 A | 10/2017 |

* cited by examiner

*Primary Examiner* — Michael P McFadden
(74) *Attorney, Agent, or Firm* — Rabin & Berdo, P.C.

(57) ABSTRACT

A chip component includes a substrate that has a first surface and a second surface on a side opposite to the first surface, a plurality of wall portions that are formed on a side of the first surface by using a part of the substrate, that have one end portion and one other end portion, and that are formed of a plurality of pillar units, a support portion that is formed around the wall portions by using a part of the substrate and that is connected to at least one of the end portion and the other end portion of the wall portions, and a capacitor portion formed by following a surface of the wall portion, in which each of the pillar units includes a central portion and three convex portions that extend from the central portion in three mutually different directions in a plan view and in which the wall portion is formed by a connection between the convex portions of the pillar units that adjoin each other.

19 Claims, 26 Drawing Sheets

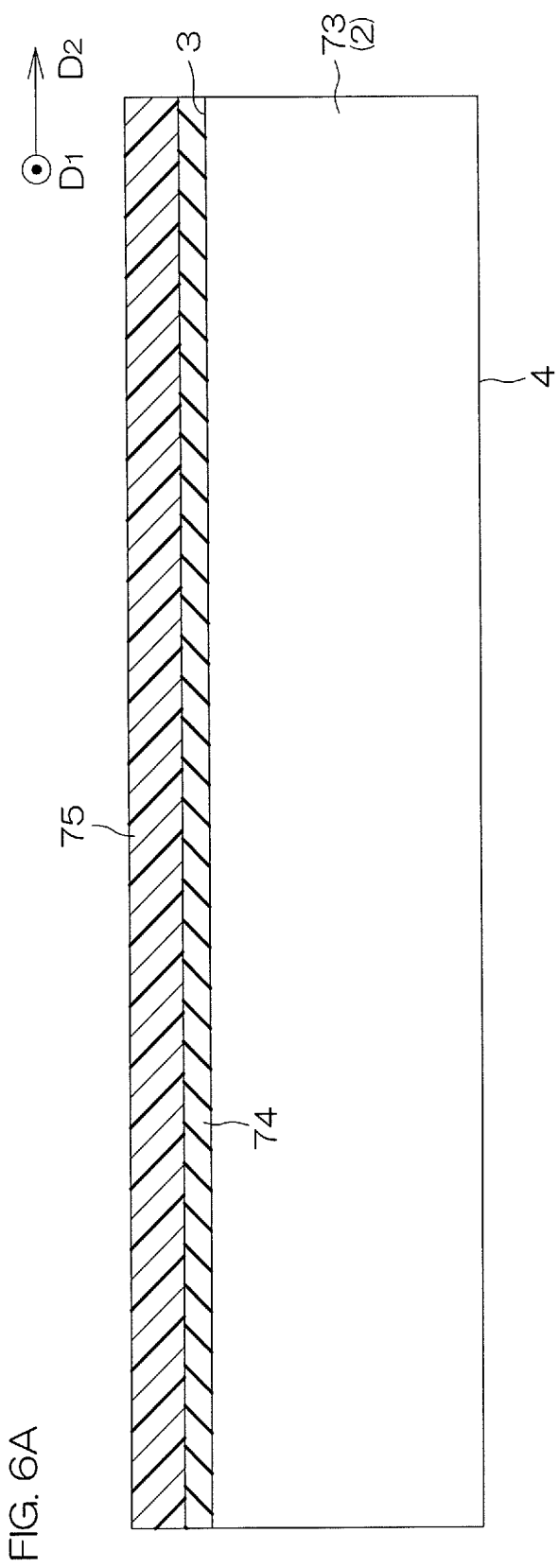

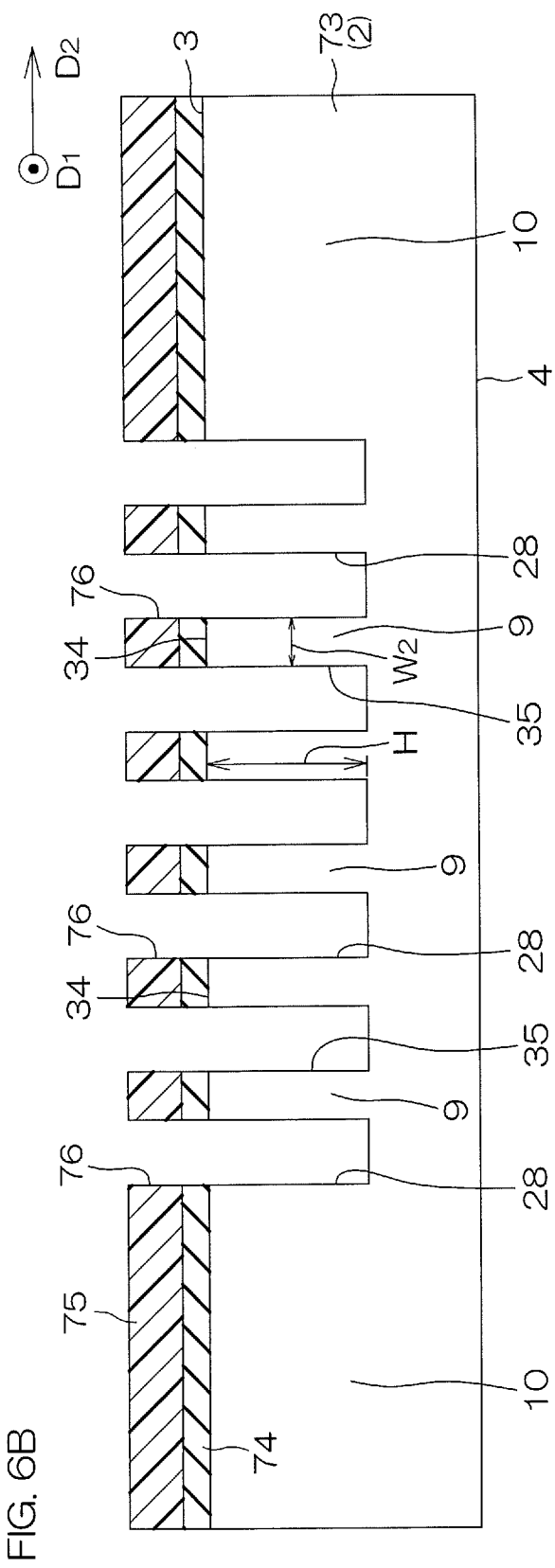

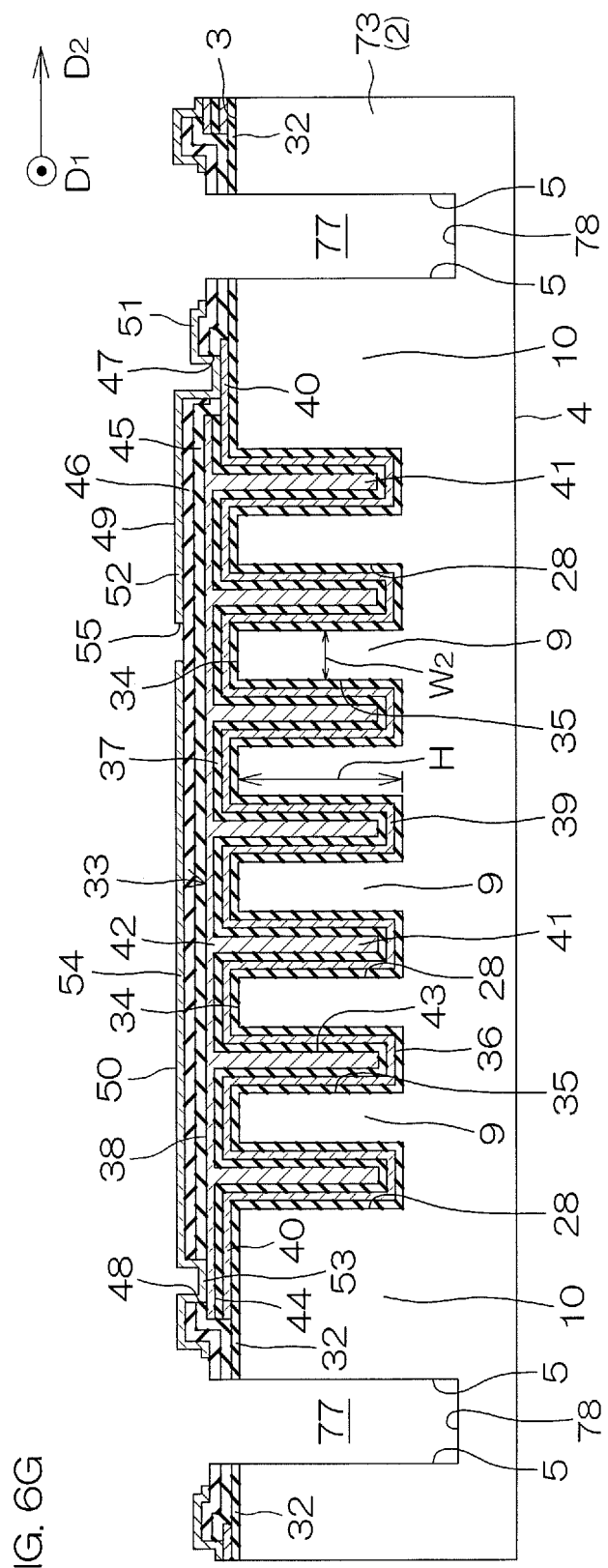

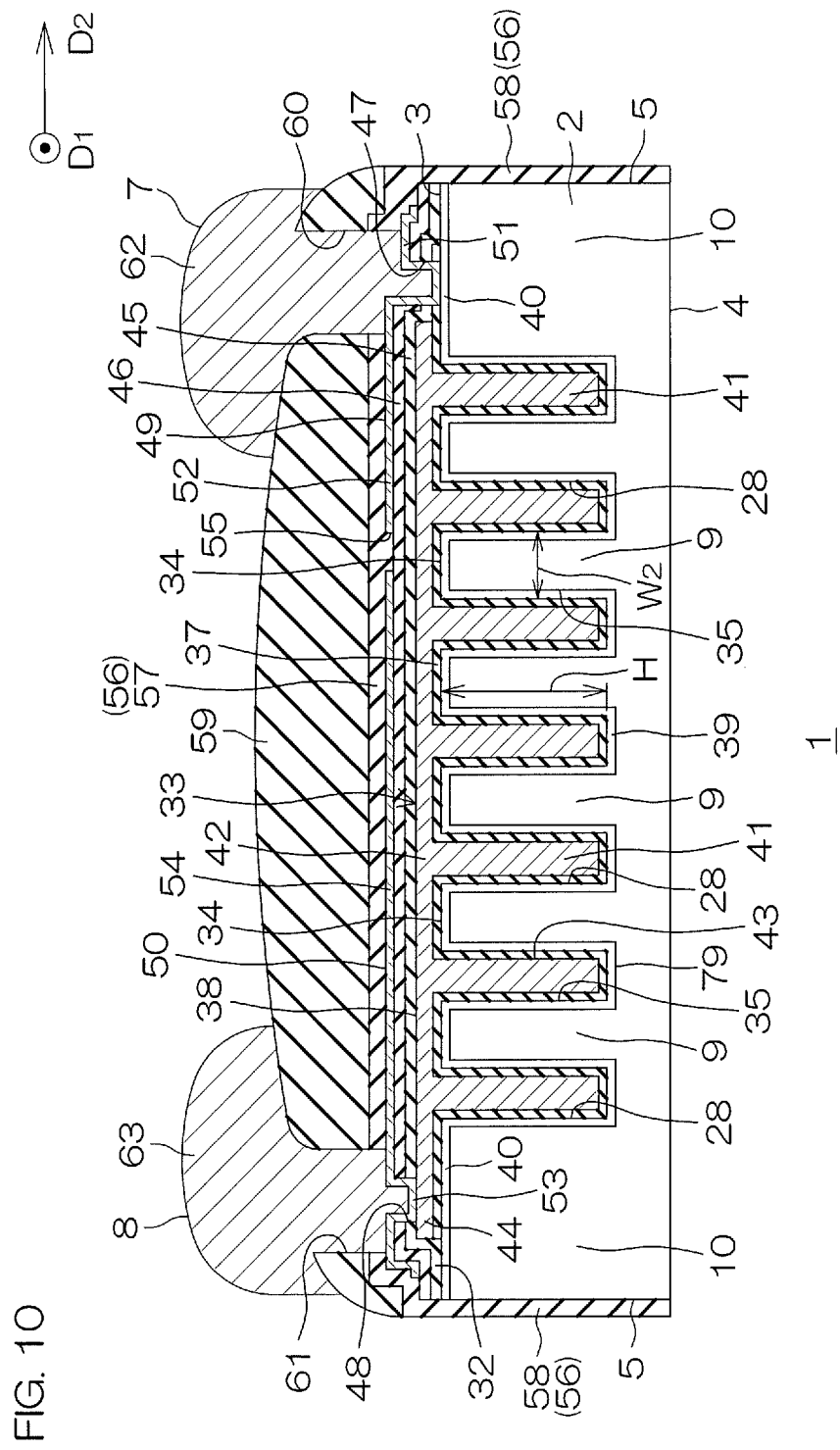

CHIP COMPONENT

CROSS-REFERENCE TO RELATED APPLICATIONS

This application corresponds to Japanese Patent Application No. 2019-147478 filed in the Japan Patent Office on Aug. 9, 2019 and Japanese Patent Application No. 2020-077712 filed in the Japan Patent Office on Apr. 24, 2020, the entire disclosures of which are incorporated herein by reference.

TECHNICAL FIELD

The present invention relates to a chip component having a capacitor portion.

BACKGROUND ART

Patent Literature 1 (Japanese Patent Application Publication No. 2017-195322) discloses a chip capacitor that includes a substrate, a first conductor film and a first pad film both of which are formed on the substrate, a dielectric film that is formed on the first conductor film and on the first pad film, and a second conductor film that is formed on the dielectric film and that includes a second connection region and a second capacitor formation region. The first conductor film includes a first connection region and a first capacitor formation region. A first external electrode is joined to the first connection region of the first conductor film, and a second external electrode is joined to the second connection region of the second conductor film.

SUMMARY OF INVENTION

The chip capacitor of Patent Literature 1 has a capacitor region having a predetermined capacity. A structure forming this capacitor region is a multilayer film consisting of the first conductor film formed on the substrate, the dielectric film, and the second conductor film. Therefore, the capacity of the capacitor region is restricted by the planar size of the substrate. Therefore, it is difficult to concurrently achieve maintaining the downsizing of an element and enlarging the capacity of the capacitor portion.

It is an object of the present invention to provide a chip component that is capable of concurrently achieving both a reduction in size of an element and an enlargement in capacity of a capacitor portion.

A chip component according to an aspect of the present invention includes a substrate that has a first surface and a second surface on a side opposite to the first surface, a plurality of wall portions that are formed on a side of the first surface by using a part of the substrate, that have one end portion and one other end portion, and that are formed of a plurality of pillar units, a support portion that is formed around the wall portions by using a part of the substrate and that is connected to at least one of the end portion and the other end portion of the wall portions, and a capacitor portion formed by following a surface of the wall portion, in which each of the pillar units includes a central portion and three convex portions that extend from the central portion in three mutually different directions in a plan view and in which the wall portion is formed by a connection between the convex portions of the pillar units that adjoin each other.

EFFECTS OF INVENTION

According to the chip component according to one aspect of the present invention, the wall portion formed on the substrate is formed of the plurality of pillar units. Each of the pillar units includes the central portion and the three convex portions extending from the central portion in three mutually different directions in a plan view. This makes it possible to make the surface area of the wall portion wider than in a case in which the wall portion is formed by connecting pillar units, such as square prisms, to each other. Additionally, the capacitor portion is formed by following the surface of the wall portion, and therefore it is possible to achieve a large capacity by raising the height of the wall portion without allowing the capacity of the capacitor portion to be restricted by the planar size of the substrate. In other words, it is possible to secure a large capacity of the capacitor portion even if the planar size of the substrate is small, and therefore it is possible to concurrently achieve both a reduction in size of the element and an enlargement in capacity of the capacitor portion.

Additionally, if the wall portion that is formed by connecting the plurality of pillar units together is employed, more excellent stability is achieved than the pillar units that are independent of each other. Additionally, the end portion and the other end portion of the wall portion are connected to the support portion disposed around the wall portion. This makes it possible to support the wall portion in a cantilever manner at least from the lateral side, and therefore it is possible to achieve reinforcement against a force applied to the wall portion in the lateral direction. As a result, it is possible to maintain the stability of the wall portion even if the height of the wall portion is raised, and therefore it is possible to improve the reliability of the element.

BRIEF DESCRIPTION OF DRAWINGS

FIG. 6A to FIG. 6L are views each of which shows part of a process of manufacturing the chip component according to the first preferred embodiment of the present invention.

FIG. 10 is a schematic cross-sectional view of a chip component according to a third preferred embodiment of the present invention.

DESCRIPTION OF EMBODIMENTS

Preferred Embodiments of the Present Invention

Figure 1:
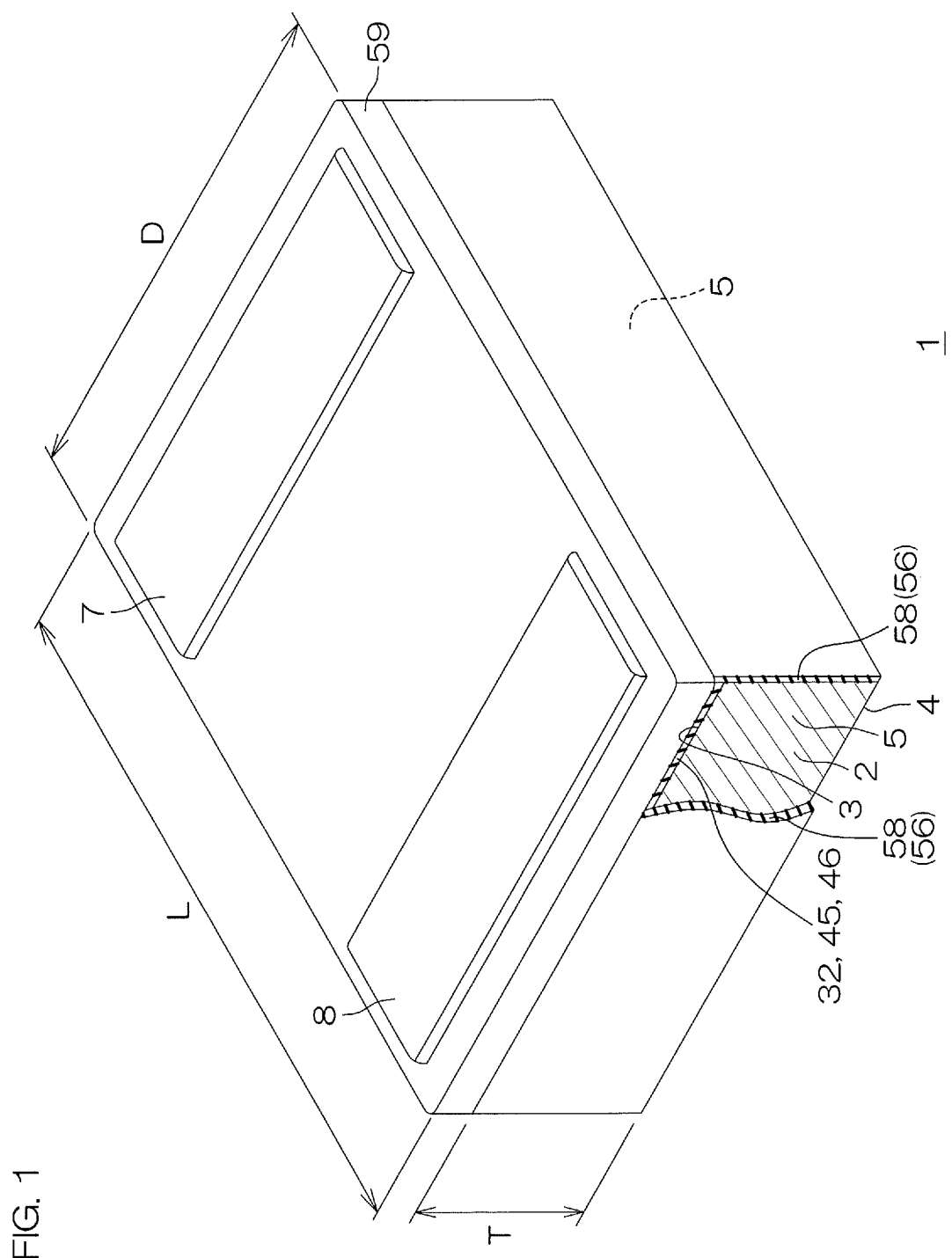
FIG. 1 is a schematic perspective view of a chip component according to a first preferred embodiment of the present invention.

First, an itemized description will be given of preferred embodiments of the present invention.

A chip component according to one preferred embodiment of the present invention includes a substrate that has a first surface and a second surface on a side opposite to the first surface, a plurality of wall portions that are formed on a side of the first surface by using a part of the substrate, that have one end portion and one other end portion, and that are formed of a plurality of pillar units, a support portion that is formed around the wall portions by using a part of the substrate and that is connected to at least one of the end portion and the other end portion of the wall portions, and a capacitor portion formed by following a surface of the wall portion, in which each of the pillar units includes a central portion and three convex portions that extend from the central portion in three mutually different directions in a plan view and in which the wall portion is formed by a connection between the convex portions of the pillar units that adjoin each other.

According to this arrangement, the wall portion formed on the substrate is formed of the plurality of pillar units. Each of the pillar units includes the central portion and the three convex portions extending from the central portion in three mutually different directions in a plan view. This makes it possible to make the surface area of the wall portion wider than in a case in which the wall portion is formed by connecting pillar units, such as square prisms, to each other. Additionally, the capacitor portion is formed by following the surface of the wall portion, and therefore it is possible to achieve a large capacity by raising the height of the wall portion without allowing the capacity of the capacitor portion to be restricted by the planar size of the substrate. In other words, it is possible to secure a large capacity of the capacitor portion even if the planar size of the substrate is small, and therefore it is possible to concurrently achieve both a reduction in size of the element and an enlargement in capacity of the capacitor portion.

Additionally, if the wall portion that is formed by connecting the plurality of pillar units together is employed, more excellent stability is achieved than the pillar units that are independent of each other. Additionally, the end portion and the other end portion of the wall portion are connected to the support portion disposed around the wall portion. This makes it possible to support the wall portion in a cantilever manner at least from the lateral side, and therefore it is possible to achieve reinforcement against a force applied to the wall portion in the lateral direction. As a result, it is possible to maintain the stability of the wall portion even if the height of the wall portion is raised, and therefore it is possible to improve the reliability of the element.

In the chip component according to one preferred embodiment of the present invention, in each of the pillar units, each of the convex portions may make an angle of 120° with an adjoining convex portion that is one of the convex portions, and each of the convex portions may intersect the adjoining convex portion at the central portion.

According to this arrangement, it is possible for at least one of the three convex portions to assume the role of a buttress that prevents the collapse of the wall portion even if a force is applied to the wall portion from any direction. As a result, it is possible to further improve the stability of the wall portion.

In the chip component according to one preferred embodiment of the present invention, a first wall portion that is one of a plurality of the wall portions may include a first main portion that extends in a first direction and that is connected to the support portion and first branch portions that extend in a second direction intersecting the first direction and that are disposed in a comb-teeth manner along the first direction, and each of the first branch portions may be formed by a first convex portion among the convex portions of each of the pillar units of the first wall portion.

In the chip component according to one preferred embodiment of the present invention, the convex portions of each of the pillar units of the first wall portion may include a second convex portion and a third convex portion excluding the first convex portion, and the first main portion may be formed by a connection between the second convex portion and the third convex portion of the pillar units that adjoin each other.

In the chip component according to one preferred embodiment of the present invention, a plurality of the wall portions may include a second wall portion that adjoins the first wall portion, and the second wall portion may include a second main portion that extends in the first direction and that is connected to the support portion and comb-teeth-shaped second branch portions that extend toward the first main portion and that are each engaged with the comb-teeth-shaped first branch portion, and each of the second branch portions may be formed by a fourth convex portion among the convex portions of each of the pillar units of the second wall portion.

In the chip component according to one preferred embodiment of the present invention, the convex portions of each of the pillar units of the second wall portion may include a fifth convex portion and a sixth convex portion excluding the fourth convex portion, and the second main portion may be formed by a connection between the fifth convex portion and the sixth convex portion of the pillar units that adjoin each other.

In the chip component according to one preferred embodiment of the present invention, a ratio (W/H) of a width W of the convex portion of the pillar unit with respect to a height H of the wall portion may be 2/50 to 2/100.

According to this arrangement, it is possible to further enlarge the capacity of the capacitor portion because the height of the wall portion is comparatively high. Moreover, the wall portion is supported by the support portion even if the height of the wall portion is thus raised, and therefore it is possible to maintain the stability of the wall portion as well.

In the chip component according to one preferred embodiment of the present invention, the support portion may be formed in an annular shape surrounding the plurality of wall portions, and the wall portion may include one end portion and one other end portion that are connected to the support portion.

According to this arrangement, both the end portion and the other end portion of the wall portion are connected to the support portion, and the wall portion is two-sidedly supported from both lateral sides. As a result, it is possible to further improve the stability of the wall portion.

The chip component according to one preferred embodiment of the present invention may include an insulating film formed on a surface of the wall portion, and the capacitor portion may include a lower electrode formed on the insulating film, a capacity film formed on the lower electrode, and an upper electrode formed on the capacity film.

In the chip component according to one preferred embodiment of the present invention, the upper electrode may include an embedded electrode that is embedded in a space between the wall portions that adjoin each other.

In the chip component according to one preferred embodiment of the present invention, the lower electrode and the upper electrode may include a polysilicon electrode, and the capacity film may include an oxide film.

The chip component according to one preferred embodiment of the present invention may include a first electrode film that is formed on the substrate and that is electrically connected to the lower electrode, a second electrode film that is formed on the substrate and that is electrically connected to the upper electrode, a surface insulating film with which the first electrode film and the second electrode film are covered, a first external electrode that is formed on the surface insulating film and that is electrically connected to the first electrode film while passing through the surface insulating film, and a second external electrode that is formed on the surface insulating film and that is electrically connected to the second electrode film while passing through the surface insulating film.

In the chip component according to one preferred embodiment of the present invention, the first electrode film may be connected to the lower electrode in a region directly under the first external electrode.

In the chip component according to one preferred embodiment of the present invention, the second electrode film may be connected to the upper electrode in a region directly under the second external electrode.

In the chip component according to one preferred embodiment of the present invention, the first electrode film and the second electrode film may include an aluminum electrode film.

In the chip component according to one preferred embodiment of the present invention, the first external electrode and the second external electrode may include a plated layer formed by plating growth.

In the chip component according to one preferred embodiment of the present invention, the wall portion may be formed in a region between the first external electrode and the second external electrode and in a region directly under both the first external electrode and the second external electrode.

In the chip component according to one preferred embodiment of the present invention, the lower electrode may have an uneven structure at a contact surface with the capacity film.

According to this arrangement, the uneven structure is formed in the lower electrode, and therefore it is possible to increase the surface area of the lower electrode. As a result, it is possible to allow the lower electrode to face the upper electrode in a wide area, and it is possible to further enlarge the capacity of the capacitor portion.

In the chip component according to one preferred embodiment of the present invention, the substrate may include a semiconductor substrate.

DETAILED DESCRIPTION OF PREFERRED EMBODIMENTS OF PRESENT INVENTION

Next, preferred embodiments of the present invention will be described in detail with reference to the accompanying drawings.

First Preferred Embodiment

Figure 2:
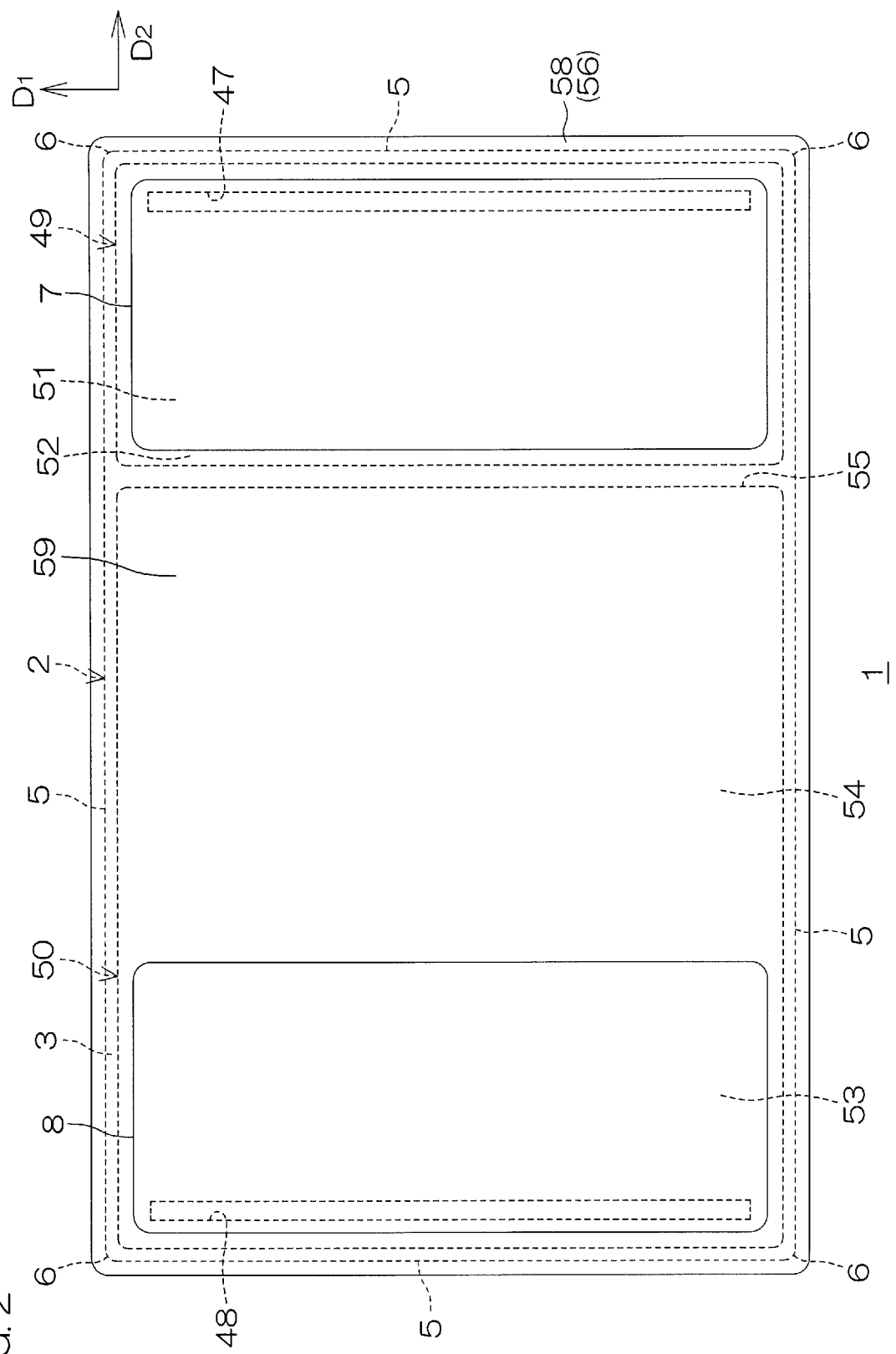
FIG. 2 is a schematic plan view of the chip component according to the first preferred embodiment of the present invention.
Figure 3:
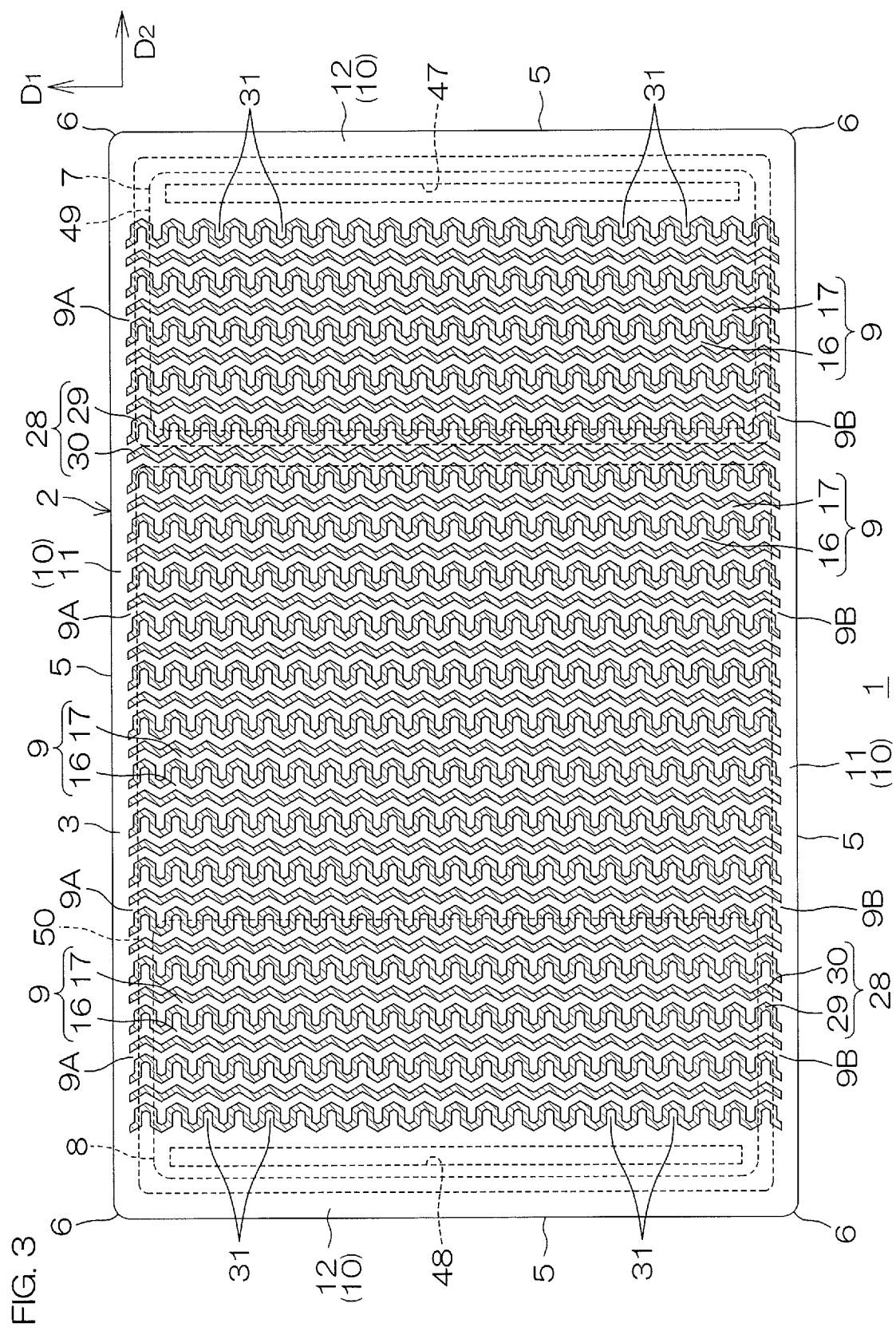
FIG. 3 is a plan view showing an internal structure of the chip component.
Figure 4:
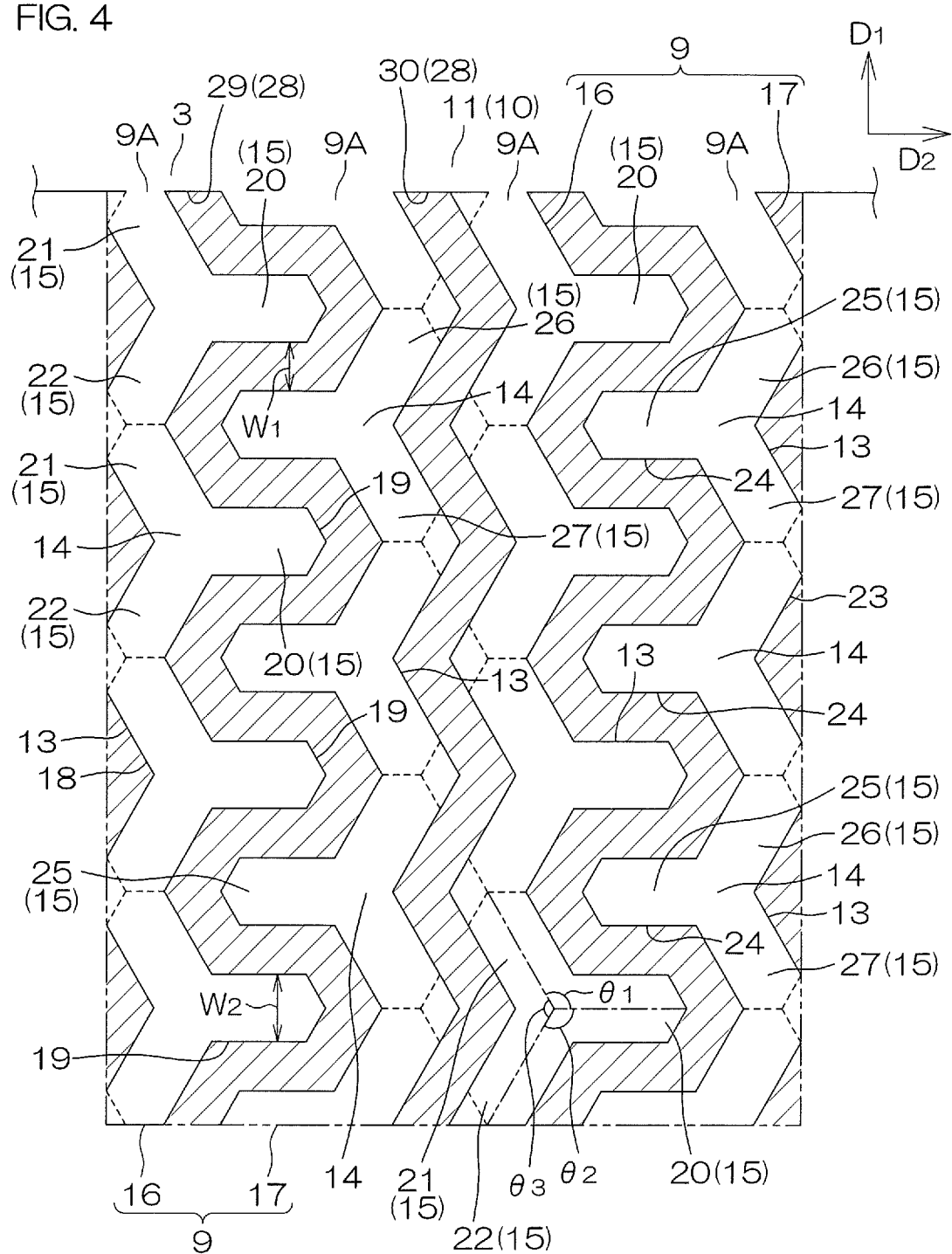
FIG. 4 is an enlarged view of a main portion of the chip component of FIG. 3.
Figure 5:
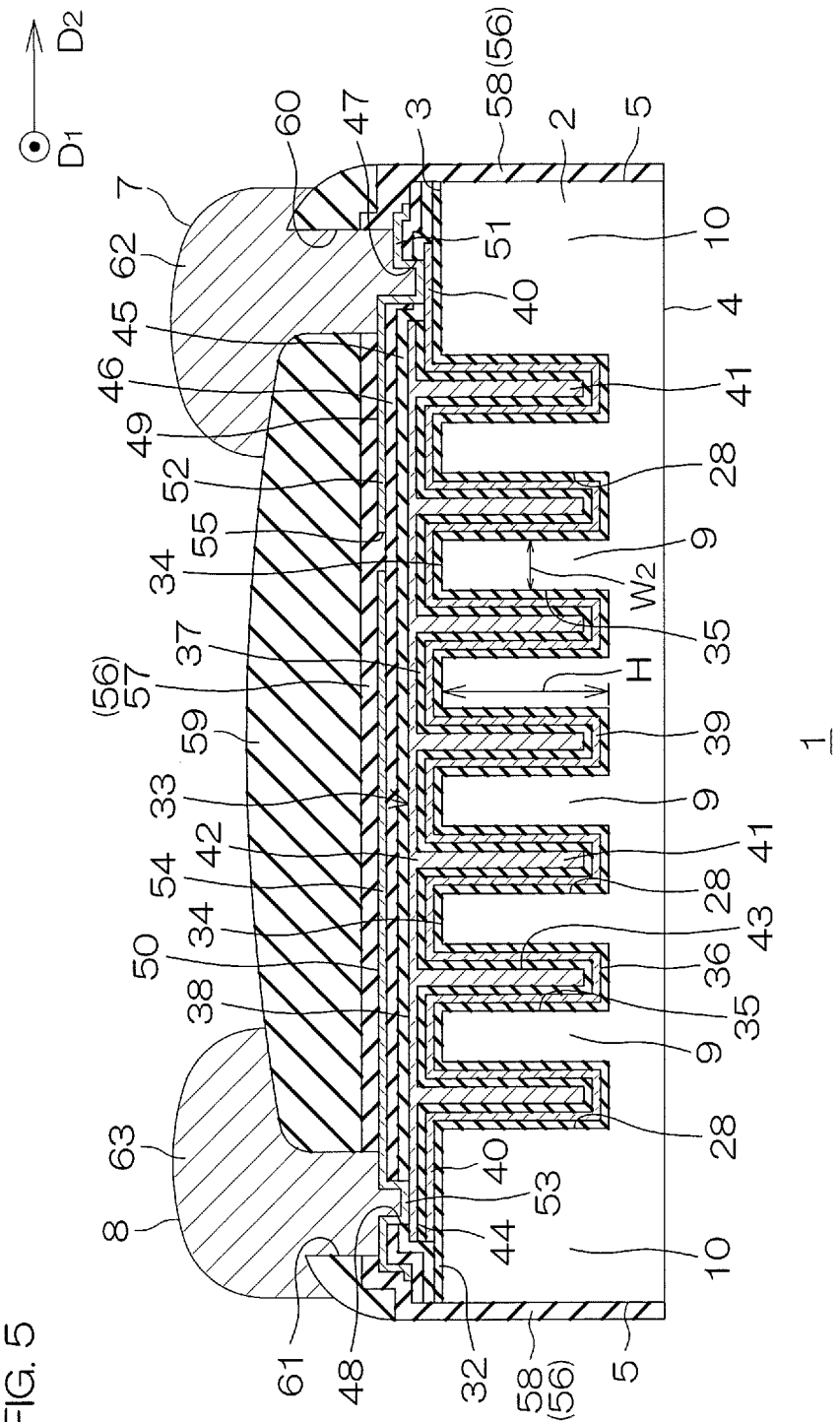
FIG. 5 is a schematic cross-sectional view of the chip component according to the first preferred embodiment of the present invention.

FIG. 1 is a schematic perspective view of a chip component 1 according to a first preferred embodiment of the present invention. FIG. 2 is a schematic plan view of the chip component 1 according to the first preferred embodiment of the present invention. FIG. 3 is a plan view showing an internal structure of the chip component 1. FIG. 4 is an enlarged view of a main portion of the chip component 1 of FIG. 3. FIG. 5 is a schematic cross-sectional view of the chip component 1 according to the first preferred embodiment of the present invention.

FIG. 5 shows not a cross-sectional structure in a specific cutting plane of the chip component 1 but a cross-sectional structure of a main portion of the chip component 1 in order to easily understand the structure of the chip component 1.

The chip component 1 is a chip capacitor on which a capacitor structure is solely mounted, and includes a substantially rectangular-parallelepiped-shaped substrate 2 forming a chip body. The substrate 2 may be a semiconductor substrate, such as a silicon substrate, and may be, besides, an insulating substrate, such as a ceramic substrate or a glass substrate. Additionally, the substrate 2 may be a p type substrate, or may be an n type substrate if the substrate 2 is a semiconductor substrate.

A length L of a long side along a longitudinal direction of the substrate 2 is, for example, 0.4 mm to 2 mm. A length D of a short side along a lateral direction of the substrate 2 is, for example, 0.2 mm to 2 mm. A thickness T of the substrate 2 is, for example, 0.1 mm to 0.5 mm.

The substrate 2 has a first surface 3, a second surface 4 positioned on the side opposite to the first surface 3, and a third surface 5 by which the first surface 3 and the second surface 4 are connected together. The first surface 3 and the second surface 4 of the substrate 2 are each formed in a rectangular shape in a plan view seen from a normal direction of those surfaces (hereinafter, referred to simply as "in a plan view").

The first surface 3, the second surface 4, and the third surface 5 of the substrate 2 may be referred to as a front surface, a rear surface, and a lateral surface of the substrate 2, respectively. Additionally, the third surface 5 is partitioned into four surfaces in total, i.e., is partitioned into a pair of surfaces facing each other in the longitudinal direction of the substrate 2 and a pair of surfaces facing each other in the lateral direction of the substrate 2 because of the fact that the substrate 2 is formed in a rectangular shape in a plan view in the present preferred embodiment. On the other hand, unlike FIG. 1, the third surface 5 is not necessarily required to be clearly partitioned into a plurality of surfaces, for example, if the substrate 2 has each corner portion that has been chamfered (e.g., if the substrate 2 has round-shaped corner portions 6 as shown in FIG. 2) even if the substrate 2 has a circular shape in a plan view, or an ellipsoidal shape in a plan view, or a rectangular shape in a plan view.

A first external electrode 7 and a second external electrode 8 are formed on the first surface 3 of the substrate 2. The first external electrode 7 is disposed at one end portion in the longitudinal direction of the substrate 2. The second external electrode 8 is disposed at the other end portion in the longitudinal direction of the substrate 2. The first external electrode 7 and the second external electrode 8 are each formed in a rectangular shape having a pair of long sides along the lateral direction of the substrate 2 in a plan view.

In the chip component 1, a part on the first-surface-3 side of the substrate 2 is selectively removed, and, as a result, the remaining part of the substrate 2 forms a plurality of wall portions 9 and a support portion 10 as shown in FIG. 3 and FIG. 5.

Each of the plurality of wall portions 9 extends in the lateral direction $D_1$ (first direction) of the substrate 2. In the present preferred embodiment, each of the wall portions 9 extends from one side to the other side of a pair of peripheral edge portions (i.e., portions close to the third surface 5) along the longitudinal direction $D_2$ (second direction) of the substrate 2. Additionally, the plurality of wall portions 9 are arranged with intervals between the wall portions 9 in the longitudinal direction $D_2$ of the substrate 2. Hence, the plurality of wall portions 9 are formed in a stripe manner in a plan view as shown in FIG. 3.

Additionally, in the present preferred embodiment, the stripe-shaped wall portions 9 are formed in a region between the first external electrode 7 and the second external electrode 8 and in a region directly under the first and second external electrodes 7 and 8 as shown in FIG. 3. Therefore, in a thickness direction of the substrate 2, some of the stripe-shaped wall portions 9 do not face the first and second external electrodes 7 and 8, and the remaining stripe-shaped wall portions 9 face the first and second external electrodes 7 and 8. The stripe-shaped wall portions 9 may be formed only in the region between the first external electrode 7 and the second external electrode 8. In this case, the first surface 3 of the substrate 2 in the region directly under the first and second external electrodes 7 and 8 may be a flat surface.

On the other hand, the support portion 10 is the remaining part of the substrate 2 formed around the plurality of wall portions 9 in the present preferred embodiment. The support portion 10 is not required to be annular although the entirety of the part formed in an annular shape (in a frame shape) along the third surface 5 of the substrate 2 is referred to as the support portion 10 in the present preferred embodiment. For example, a part including the pair of third surfaces 5 and 5 along the longitudinal direction $D_2$ of the substrate 2 and only a part connected to one end portion 9A and/or the other end portion 9B in the longitudinal direction (extending direction) of each of the wall portions 9 may be referred to as the support portion 10.

Referring to FIG. 3, the support portion 10 integrally includes a first support portion 11 having a comparatively narrow width and a second support portion 12 having a width comparatively wider than the first support portion 11. Although the first support portion 11 is a pair of parts along the longitudinal direction $D_2$ of the substrate 2 and although the second support portion 12 is a pair of parts along the lateral direction $D_1$ of the substrate 2 in the present preferred embodiment, these support portions 11 and 12 may be disposed mutually oppositely.

Next, a structure of the wall portion 9 will be concretely described with reference to FIG. 4 and FIG. 5.

Referring to FIG. 4, the wall portion 9 is formed of a plurality of pillar units 13. The term "the wall portion 9 is formed of a plurality of pillar units 13" mentioned here may denote that a linear wall portion 9 is formed, for example, by allowing pillar-shaped objects (in the present preferred embodiment, pillar units 13) that are identical in shape with each other to lie in a line in a plan view. In other words, the wall portion 9 can be divided into the pillar units 13 that are identical in shape with each other by means of the phantom line as shown by the broken line in FIG. 4 although the wall portion 9 itself is not formed in a pillar shape. Therefore, raw-material parts of the substrate 2 (in the present preferred embodiment, semiconductor parts) are continuous in a boundary portion between convex portions 15 of mutually-adjoining pillar units 13. Hence, mutually-adjoining convex portions are integrally connected to each other through the raw-material parts of the substrate 2.

Each of the pillar units 13 includes a central portion 14 and three convex portions 15 that extend from the central portion 14 in three mutually different directions in a plan view. The wall portion 9 is formed by a connection between convex portions 15 of mutually-adjoining pillar units 13. More specifically, in each of the pillar units 13, each of the convex portions 15 makes an angle $\theta_1$ of 120°, an angle $\theta_2$ of 120°, and an angle $\theta_3$ of 120° with an adjoining convex portion 15, and intersects the adjoining convex portion 15 in the central portion 14.

The angles $\theta_1$, $\theta_2$, and $\theta_3$ may be mutually different although these angles are equal to each other and although each angle is 120° in the present preferred embodiment. For example, the angle $\theta_3$ between a second convex portion 21 and a third convex portion 22, both of which will be described later, may be 160°, and the angle $\theta_1$ between the first convex portion 20 and the second convex portion 21 and the angle $\theta_2$ between the first convex portion 20 and the third convex portion 22 may be each 100°.

Additionally, a pair of mutually-adjoining wall portions 9 among the plurality of wall portions 9 may be referred to as a first wall portion 16 and a second wall portion 17, respectively, in the present preferred embodiment.

The first wall portion 16 includes a first main portion 18 that extends in the lateral direction $D_1$ of the substrate 2 and that is connected to the support portion 10 (first support portion 11) and first branch portions 19 that extend in the longitudinal direction $D_2$ of the substrate 2 and that are arranged in a comb-teeth manner along the lateral direction $D_1$ of the substrate 2. Each of the first branch portions 19 is formed by the first convex portion 20 among the convex portions 15 of each of the pillar units 13 of the first wall portion 16.

On the other hand, the convex portions 15 of each of the pillar units 13 of the first wall portion 16 include the second convex portion 21 and the third convex portion 22 excluding than the first convex portion 20. The first main portion 18 is formed by a connection between the second convex portion 21 and the third convex portion 22 of mutually-adjoining pillar units 13. In other words, the second convex portion 21 and the third convex portion 22 are alternately disposed along the lateral direction $D_1$ of the substrate 2 in the present preferred embodiment, and the first main portion 18 is formed in a wave shape (zigzag shape) as a whole in a plan view.

The convex portions 15 that form one end portion 9A and the other end portion 9B of the first main portion 18 (not shown in FIG. 4) are connected to the support portion 10 (first support portion 11). More specifically, raw-material parts of the substrate 2 (in the present preferred embodiment, semiconductor parts) are continuous in a boundary portion between the support portion 10 and the first main portion 18. Hence, the support portion 10 and the first main portion 18 are integrally connected together through the raw-material parts of the substrate 2.

The second wall portion 17 includes a second main portion 23 that extends in the lateral direction $D_1$ of the substrate 2 and that is connected to the support portion 10 (first support portion 11) and comb-teeth-shaped second branch portions 24 that extend toward the first main portion 18 and that are engaged with the comb-teeth-shaped first branch portions 19, respectively. Each of the second branch portions 24 is formed by a fourth convex portion among the convex portions 15 of each of the pillar units 13 of the second wall portion 17.

On the other hand, the convex portions 15 of each of the pillar units 13 of the second wall portion 17 include a fifth convex portion 26 and a sixth convex portion 27 excluding the fourth convex portion 25. The second main portion 23 is formed by a connection between the fifth convex portion 26 and the sixth convex portion 27 of the mutually-adjoining pillar units 13. In other words, the fifth convex portion 26 and the sixth convex portion 27 are alternately disposed along the lateral direction $D_1$ of the substrate 2 in the present preferred embodiment, and the second main portion 23 is formed in a wave shape (zigzag shape) as a whole in a plan view.

The convex portions 15 that form one end portion 9A and the other end portion 9B of the second main portion 23 (not shown in FIG. 4) are connected to the support portion 10 (first support portion 11). More specifically, raw-material parts of the substrate 2 (in the present preferred embodiment, semiconductor parts) are continuous in a boundary portion between the support portion 10 and the second main portion 23. Hence, the support portion 10 and the second main portion 23 are integrally connected together through the raw-material parts of the substrate 2.

Additionally, in the present preferred embodiment, the pair of wall portions 9 consisting of the first wall portion 16 and the second wall portion 17, which are engaged with each other in a comb-teeth manner, are formed in order along the longitudinal direction $D_2$ of the substrate 2. In other words, the first wall portion 16 and the second wall portion 17 are alternately arranged along the longitudinal direction $D_2$ of the substrate 2. A gap 28 is formed between the first wall portion 16 and the second wall portion 17. The gap 28 is a part from which the raw material of the substrate 2 has been removed and that is surrounded by the wall portions 9 and the support portion 10. A width $W_1$ of the gap 28 may be, for example, 2 μm to 8 μm. For clarity, the gap 28 is hatched in FIG. 3 and FIG. 4.

The gap 28 may include a first gap 29 and a second gap 30 in the present preferred embodiment. The first gap 29 may be formed between the first wall portion 16 and the second wall portion 17 that are engaged together in a comb-teeth manner, and may be formed in a meandering manner. The second gap 30 may be formed between the first wall portion 16 and the second wall portion 17 that face each other through a plane on the side opposite to the comb teeth, and may be formed in a wave shape (zigzag shape).

Additionally, in the present preferred embodiment, a ratio ($W_2$/H) of a width $W_2$ of the convex portion 15 of the pillar unit 13 with respect to the height H of the wall portion 9 (depth of the gap 28) may be 2/50 to 2/100 as shown in FIG. 5. The width $W_2$ of the convex portion 15 may be defined as the width in a direction perpendicular to a direction extending from the central portion 14 of each of the convex portions 15 as shown in FIG. 4.

In detail, the width $W_2$ of the convex portion 15 of the pillar unit 13 may be, for example, 2 μm to 8 μm. On the other hand, the height H of the wall portion 9 may be 50 μm to 400 μm.

Referring to FIG. 3, a plurality of convex portions 31 that protrude toward the wall portion 9 may be formed at the second support portion 12 formed along the wall portion 9 in the support portion 10. The plurality of convex portions 31 may extend toward the wall portion 9, and may be arranged in a comb-teeth manner so as to be engaged with the comb-teeth-shaped first or second branch portions 19 or 24 (not shown in FIG. 3).

An insulating film 32 is formed on the first surface 3 of the substrate 2 so as to cover the whole area of the first surface 3 of the substrate 2 as shown in FIG. 1 and FIG. 5. The insulating film 32 is formed on the entirety of the surface (an upper surface 34 and a lateral surface 35) of the wall portion 9 in addition to the first surface 3 that is a flat surface of the substrate 2. The insulating film 32 has an end surface that coincides with the third surface 5 of the substrate 2. The insulating film 32 may be, for example, a $SiO_2$ film or a SiN film. The thickness of the insulating film 32 may be, for example, 20000 Å to 40000 Å (2 μm to 4 μm).

A capacitor portion 33 is formed on the insulating film 32. The capacitor portion 33 is formed by following the upper surface 34 and the lateral surface 35 of the wall portion 9. In other words, the capacitor portion 33 has at least a lower electrode 36 that coincides with an uneven shape in the width direction and in the height direction of the wall portion 9. In the present preferred embodiment, the lower electrode 36 is formed on the insulating film 32, and is formed as an electrode film that has one surface that is contiguous to the upper surface 34 and to the lateral surface 35 of the wall portion 9 and the other surface that is equidistant from the upper surface 34 and from the lateral surface 35 of the wall portion 9. In other words, the lower electrode 36 has a predetermined thickness along the upper surface 34 and along the lateral surface 35 of the wall portion 9.

A capacity film 37 is formed on the lower electrode 36, and an upper electrode 38 is formed on the capacity film 37.

The lower electrode 36 integrally includes a first portion 39 that faces the upper surface 34 and the lateral surface 35 of the wall portion 9 and that includes a counter electrode with respect to the upper electrode 38 and a second portion 40 that is drawn out from the first portion 39 onto the first surface 3 of the substrate 2 and that includes a contact portion with respect to the first external electrode 7. The first portion 39 and the second portion 40 of the lower electrode 36 may be referred to as a capacitor region and as a contact region of the lower electrode 36, respectively, in accordance with their roles. The contact region of the second portion 40 of the lower electrode 36 is drawn out more outwardly than the upper electrode 38, and does not face the upper electrode 38 in the thickness direction of the substrate 2.

Additionally, the lower electrode 36 may be made of a semiconductor material, such as polysilicon, or may be made of a metallic material including Cu or Al. If it is a metallic material, the lower electrode 36 may be made of, for example, Cu, Al, AlSi, or AlCu. Additionally, the thickness of the lower electrode 36 may be, for example, 4000 Å to 6000 Å (400 nm to 600 nm).

The capacity film 37 is formed by following the shape of the lower electrode 36, and coincides with an uneven shape in the width direction and in the height direction of the wall portion 9. The capacity film 37 is merely required to cover at least the first portion 39 of the lower electrode 36.

Additionally, the capacity film 37 may be, for example, a $SiO_2$ film or a SiN film, or may be a multilayer film consisting of these films. For example, the capacity film 37 may be a $SiO_2$/SiN multilayer film or a $SiO_2$/SiN/$SiO_2$ multilayer film. Additionally, the capacity film 37 may be an insulating film made of a high dielectric material (high-k material). A perovskite compound, such as strontium titanate ($SrTiO_3$), barium strontium titanate ($Ba_xSr_{1-x}$)$TiO_3$, etc., in addition to tantalum pentoxide ($Ta_2O_5$) and hafnium oxide ($HfO_2$), can be mentioned as the high dielectric material. Additionally, the thickness of the capacity film 37 may be, for example, 100 Å to 1000 Å (10 nm to 100 nm).

The upper electrode 38 is embedded in the gap 28, and is formed along the first surface 3 of the substrate 2. The upper electrode 38 integrally includes a first portion 41 embedded in the gap 28 and a second portion 42 that is connected to an upper end of the first portion 41 and that is flattened along the first surface 3 of the substrate 2. The first portion 41 and the second portion 42 of the upper electrode 38 may be respectively referred to as an embedded portion and a flat portion of the upper electrode 38 in accordance with their forms.

The entirety of the first portion 41 and a part facing the lower electrode 36 of the second portion 42 are capacitor regions 43 of the upper electrode 38. A region drawn out from a formation region of the wall portion 9 of the second portion 42 onto the first surface 3 of the substrate 2 is a contact region 44 with respect to the second external electrode 8. As shown in FIG. 5, the contact region 44 of the upper electrode 38 may face a part of the second portion 40 of the lower electrode 36 (part excluding the contact region) with the capacity film 37 between the contact region 44 and the part of the second portion 40. Hence, it is possible to use this laminated structure portion as a capacitor as well, and hence is possible to further enlarge the capacity of the capacitor portion 33.

The upper electrode 38 may be made of, for example, a semiconductor material, such as polysilicon, or may be made of a metallic material including Cu or Al. If it is a metallic material, the upper electrode 38 may be made of, for example, Cu, Al, AlSi, or AlCu. Additionally, the thickness of the upper electrode 38 (second portion 42) may be, for example, 5000 Å to 10000 Å (500 nm to 1000 nm).

A first insulating film 45 and a second insulating film 46 are additionally formed on the substrate 2. The first insulating film 45 covers the insulating film 32 and the upper electrode 38, and is stacked on these constituents. The second insulating film 46 is stacked on the first insulating film 45. The first insulating film 45 and the second insulating film 46 each have an end surface that coincides with the third surface 5 of the substrate 2. Therefore, the insulating film 32, the first insulating film 45, and the second insulating film 46 may have a stacked-layer interface exposed on an extension line of the third surface 5 of the substrate 2 in a cross-sectional view shown in FIG. 5.

A first contact hole 47 by which the second portion 40 (contact region) of the lower electrode 36 is exposed and a second contact hole 48 by which the contact region 44 of the upper electrode 38 is exposed are formed in the first insulating film 45 and the second insulating film 46. The first contact hole 47 and the second contact hole 48 are formed in a region directly under the first external electrode 7 and in a region directly under the second external electrode 8, respectively. Additionally, the first contact hole 47 and the second contact hole 48 are each formed so as to linearly extend along the lateral direction $D_1$ of the substrate 2.

Specific limitations are not imposed on the formation positions and the shapes of the first and second contact holes 47 and 48 if the lower electrode 36 and the upper electrode 38 can be exposed. For example, the first contact hole 47 and the second contact hole 48 may be each formed in a region between the first external electrode 7 and the second external electrode 8. Additionally, the first contact hole 47 and the second contact hole 48 may be each formed in a circular shape, a quadrilateral shape, or the like.

Referring chiefly to FIG. 2 and FIG. 5, a first electrode film 49 and a second electrode film 50 are formed with an interval between the first and second electrode films 49 and 50 on the second insulating film 46.

The first electrode film 49 integrally includes a first pad portion 51 that is disposed directly under the first external electrode 7 and that faces the first external electrode 7 and a first drawn portion 52 that is drawn out from the first pad portion 51 toward the second-external-electrode-8 side along the first surface 3 of the substrate 2 and that is formed between the first external electrode 7 and the second external electrode 8. The first pad portion 51 enters the first contact hole 47, and is connected to the lower electrode 36.

The second electrode film 50 integrally includes a second pad portion 53 that is disposed directly under the second external electrode 8 and that faces the second external electrode 8 and a second drawn portion 54 that is drawn out from the second pad portion 53 toward the first-external-electrode-7 side along the first surface 3 of the substrate 2 and that is formed between the first external electrode 7 and the second external electrode 8. The second pad portion 53 enters the second contact hole 48, and is connected to the upper electrode 38.

The first electrode film 49 and the second electrode film 50 are formed on substantially the entirety of the first surface 3 of the substrate 2 as a whole except a region of a gap 55 (for example, about 2 μm) between the first and second electrode films 49 and 50 as shown in FIG. 2. Hence, substantially the whole area of the first surface 3 of the substrate 2 is covered with the electrode films 49 and 50, and therefore it is possible to evenly disperse an external force applied to the first surface 3, and it is possible to lessen a shock.

Additionally, the first electrode film 49 and the second electrode film 50 may employ a material including Al as an electrode material for the electrode films 49 and 50. For example, AlCu, AlSiCu, etc., can be mentioned as such a material, and it is preferable to employ AlCu.

The second electrode film 50 is formed larger than the first electrode film 49 in FIG. 2, and covers most of the stripe-shaped wall portion 9 in a plan view (see FIG. 3). However, specific limitations are not imposed on a magnitude relationship between the first electrode film 49 and the second electrode film 50, and it is allowable to, for example, change the position or the shape of the gap 55 by being appropriately set. For example, the first electrode film 49 may be larger than the second electrode film 50.

A surface insulating film 56 is additionally formed on the substrate 2. The surface insulating film 56 covers the first electrode film 49 and the second electrode film 50. The surface insulating film 56 may be, for example, a $SiO_2$ film or a SiN film. The thickness of the surface insulating film 56 may be, for example, 10000 Å to 15000 Å (1 μm to 1.5 μm).

Additionally, the surface insulating film 56 integrally includes a first portion 57 with which a region on the first surface 3 of the substrate 2 is covered and a second portion 58 with which the third surface 5 of the substrate 2 is covered. Hence, in the substrate 2, the second surface 4 is an exposed surface, and, on the other hand, the entirety of the remaining surfaces except the second surface 4 is covered with the surface insulating film 56.

A surface protection film 59 is formed on the first portion 57 of the surface insulating film 56. The surface protection film 59 may be a resin film, such as a polyimide film. The thickness of the surface protection film 59 may be, for example, 20000 Å to 100000 Å (2 μm to 10 μm).

Additionally, the surface protection film 59 is formed so that a central portion in the longitudinal direction $D_2$ of the substrate 2 swells upwardly (in a direction away from the first surface 3 of the substrate 2) between the first external electrode 7 and the second external electrode 8.

A first pad opening 60 by which the first pad portion 51 is exposed is formed in the surface insulating film 56 and in the surface protection film 59. Additionally, a second pad opening 61 by which the second pad portion 53 is exposed is formed in the surface insulating film 56 and in the surface protection film 59.

The first external electrode 7 is formed in the first pad opening 60. The first external electrode 7 is electrically connected to the first pad portion 51 in the first pad opening 60. Hence, the first external electrode 7 is electrically connected to the lower electrode 36 through the first electrode film 49.

The second external electrode 8 is formed in the second pad opening 61. The second external electrode 8 is electrically connected to the second pad portion 53 in the second pad opening 61. Hence, the second external electrode 8 is electrically connected to the upper electrode 38 through the second electrode film 50.

The first external electrode 7 and the second external electrode 8 have a first projection portion 62 and a second projection portion 63, respectively, both of which protrude from a surface of the surface protection film 59.

The first projection portion 62 has a drawn portion that is drawn out from the first pad opening 60 toward the second-external-electrode-8 side along the first surface 3 of the substrate 2 and that is formed between the first external electrode 7 and the second external electrode 8. Likewise, the second projection portion 63 has a drawn portion that is drawn out from the second pad opening 61 toward the first-external-electrode-7 side along the first surface 3 of the substrate 2 and that is formed between the first external electrode 7 and the second external electrode 8.

Additionally, the first external electrode 7 and the second external electrode 8 may be each, for example, a Ni/Pd/Au multilayer film including a Ni film, a Pd film, and an Au film that are stacked together in this order from the substrate-2 side. These multilayer films may be each a plated layer formed by plating growth.

According to this chip component 1, the wall portion 9 formed at the substrate 2 is formed of the plurality of pillar units 13. Each of the pillar units 13 includes the central portion 14 and the three convex portions 15 that extend from the central portion 14 in three mutually different directions in a plan view. This makes it possible to make the surface area of the wall portion 9 wider than in a case in which, for example, the wall portion 9 is formed by connecting pillar units, such as square prisms, to each other.

Additionally, the lower electrode 36, the capacity film 37, and the upper electrode 38 are formed by following the upper surface 34 and the lateral surface 35 of the wall portion 9, and therefore it is possible to achieve a large capacity by raising the height H of the wall portion 9 without allowing the capacity of the capacitor portion 33 to be restricted by the planar size of the substrate 2. In other words, it is possible to secure a large capacity of the capacitor portion 33 even if the planar size of the substrate 2 is small, and therefore it is possible to concurrently achieve both a reduction in size of the element and an enlargement in capacity of the capacitor portion 33.

Additionally, if the wall portion 9 that is formed by connecting the plurality of pillar units 13 together is employed, more excellent stability is achieved than the pillar units 13 that are independent of each other. Additionally, one end portion 9A and the other end portion 9B of the wall portion 9 are connected to the support portion 10 disposed around the wall portions 9. This makes it possible to two-sidedly support the wall portion 9 from the lateral sides, and therefore it is possible to achieve reinforcement against a force applied to the wall portion 9 in the lateral direction. As a result, it is possible to maintain the stability of the wall portion 9 even if the height H of the wall portion 9 is raised, and therefore it is possible to improve the reliability of the element.

More specifically, the ratio ($W_2/H$) of the width $W_2$ of the convex portion 15 of the pillar unit 13 with respect to the height H (depth of the gap 28) of the wall portion 9 may be 2/50 to 2/100. The wall portion 9 is supported by the support portion 10 even if the height H of the wall portion 9 is thus raised, and therefore it is possible to maintain the stability of the wall portion 9 as well.

Additionally, in each of the pillar units 13, each of the convex portions 15 makes an angle $\Xi_1$ of 120°, an angle $\theta_2$ of 120°, and an angle $\theta_3$ of 120° with an adjoining convex portion 15, and intersects the adjoining convex portion 15 in the central portion 14. Therefore, it is possible for at least one of the three convex portions 15 to assume the role of a buttress that prevents the collapse of the wall portion 9 even if a force is applied to the wall portion 9 from any direction. As a result, it is possible to further improve the stability of the wall portion 9.

FIG. 6A to FIG. 6L are views each of which shows part of a process of manufacturing the chip component 1 according to the first preferred embodiment of the present invention.

To manufacture the chip component 1, a wafer 73 that is an original base of the substrate 2 is first prepared as shown in FIG. 6A. Thereafter, the first surface 3 of the wafer 73 is, for example, thermally oxidized, and, as a result, a mask 74 (hard mask) made of $SiO_2$ is formed. Thereafter, a resist 75 is applied onto the mask 74.

Thereafter, an opening 76 is formed in the resist 75 and in the mask 74 as shown in FIG. 6B, and then the wafer 73 is selectively etched from the first-surface-3 side through the mask 74. Hence, a gap 28 is formed in a removed part of the wafer 73, and the wall portion 9 and the support portion 10 are formed at parts excluding the gap 28. Preferably, dry etching is employed as an etching method. Dry etching makes it possible to raise the ratio ($W_2/H$) of the width $W_2$ of the convex portion 15 of the pillar unit 13 with respect to the height H of the wall portion 9 (i.e., to make a high aspect ratio).

Figure 6C:
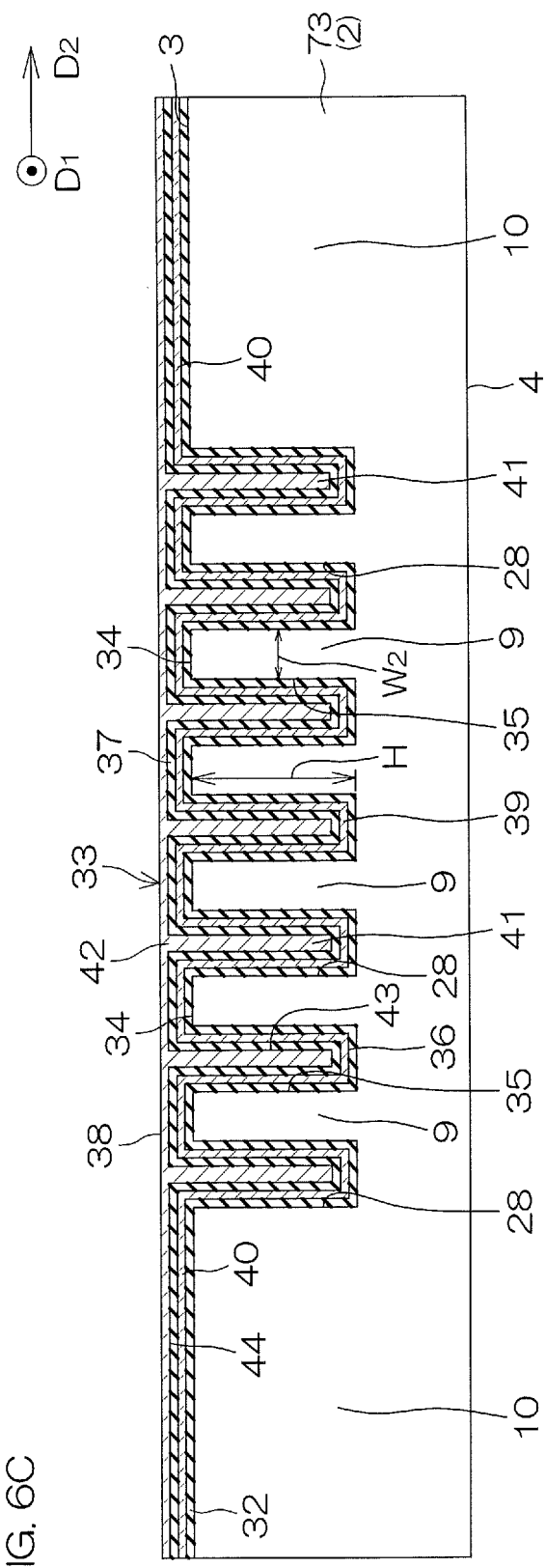

Thereafter, the first surface 3 of the wafer 73 and the upper surface 34 and the lateral surface 35 of the wall portion 9 are, for example, thermally oxidized, and, as a result, the insulating film 32 made of $SiO_2$ is formed as shown in FIG. 6C. Thereafter, the lower electrode 36, the capacity film 37, and the upper electrode 38 are formed in this order by, for example, a CVD method. In a film-forming process of forming the lower electrode 36, the capacity film 37, and the upper electrode 38, a source gas according to each of these constituents is supplied into a chamber of a CVD apparatus.

Figure 6D:
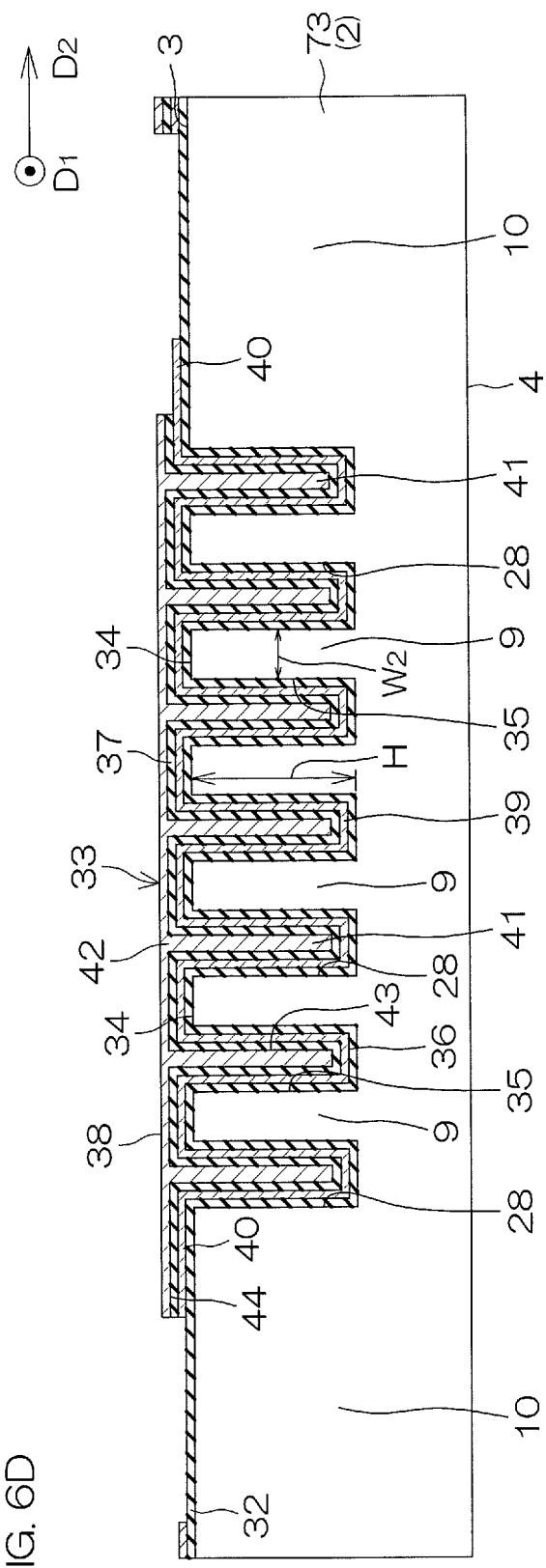

Thereafter, the upper electrode 38, the capacity film 37, and the lower electrode 36 are subjected to patterning in this order, and, as a result, the upper electrode 38, the capacity film 37, and the lower electrode 36 are selectively removed as shown in FIG. 6D. The insulating film 32 is exposed from a region from which the film and the electrodes have been removed.

Figure 6E:
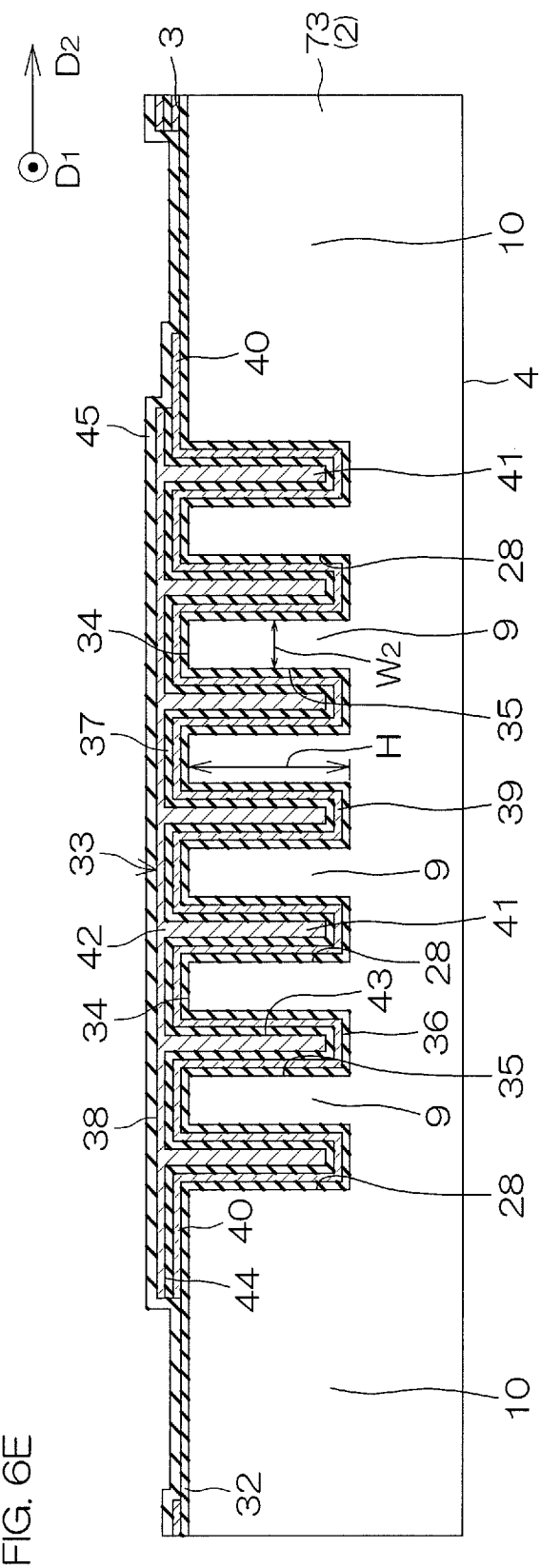

Thereafter, the first insulating film 45 is formed by, for example, the CVD method as shown in FIG. 6E.

Figure 6F:
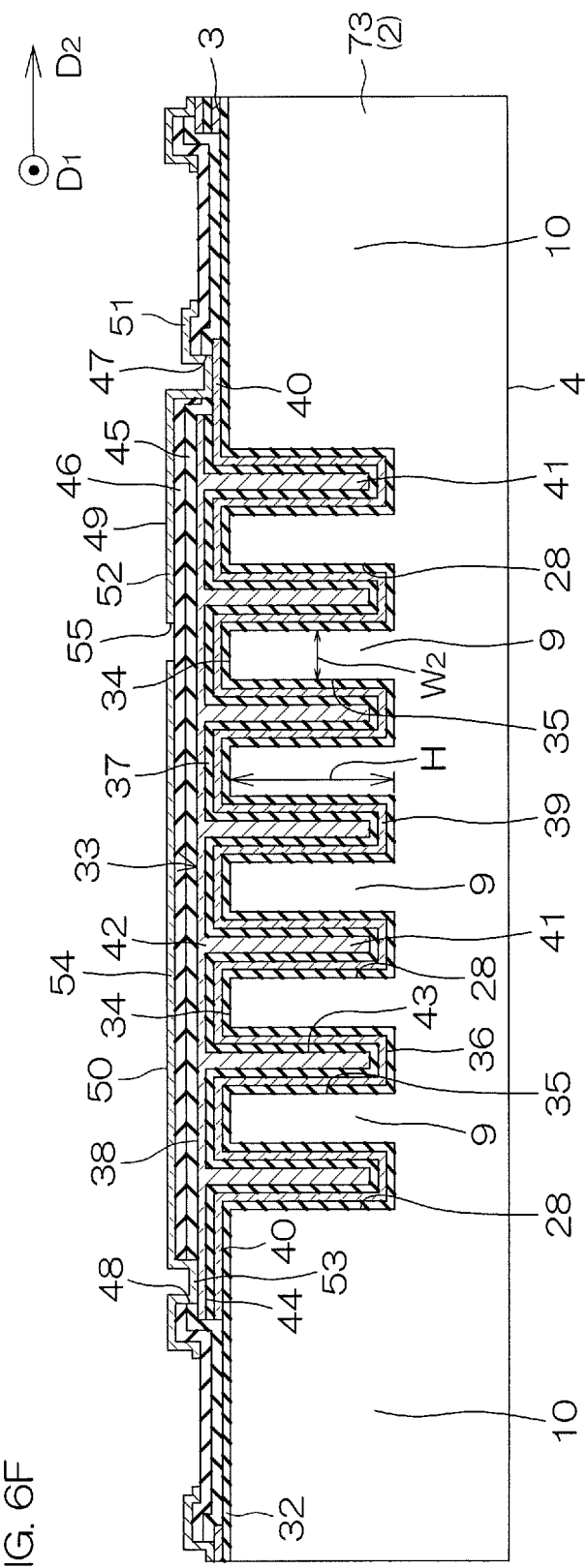

Thereafter, the second insulating film 46 is formed by, for example, the CVD method as shown in FIG. 6F. Thereafter, the second insulating film 46 and the first insulating film 45 are subjected to patterning, and, as a result, the second insulating film 46 and the first insulating film 45 are selectively removed. Hence, the first contact hole 47 and the second contact hole 48 are formed. Thereafter, a material for the first electrode film 49 and a material for the second electrode film 50 are deposited for film formation by, for example, a sputtering method, and then are subjected to patterning, and, as a result, the first electrode film 49 and the second electrode film 50 are formed.

Thereafter, the wafer 73 is selectively removed by plasma etching through a mask (not shown) as shown in FIG. 6G. Hence, a material for the wafer 73 is removed in a boundary region between mutually-adjoining element regions (in each of which each individual chip component 1 is formed). As a result, a groove 77, which has a predetermined depth ranging from the first surface 3 of the wafer 73 to a halfway position in thickness of the wafer 73, is formed. The groove 77 is defined by a pair of lateral surfaces (third surfaces 5 of the chip component 1) facing each other and by a bottom surface 78 by which lower ends of the pair of third surfaces 5 (ends on the second-surface-4 side of the wafer 73) are connected together. For example, the depth of the groove 77 may be about 100 μm based on the first surface 3 of the wafer 73, and the width of the groove 77 (i.e., interval between the third surfaces 5 facing each other) may be about 20 μm, and may be constant in the whole area in the depth direction.

Figure 6H:
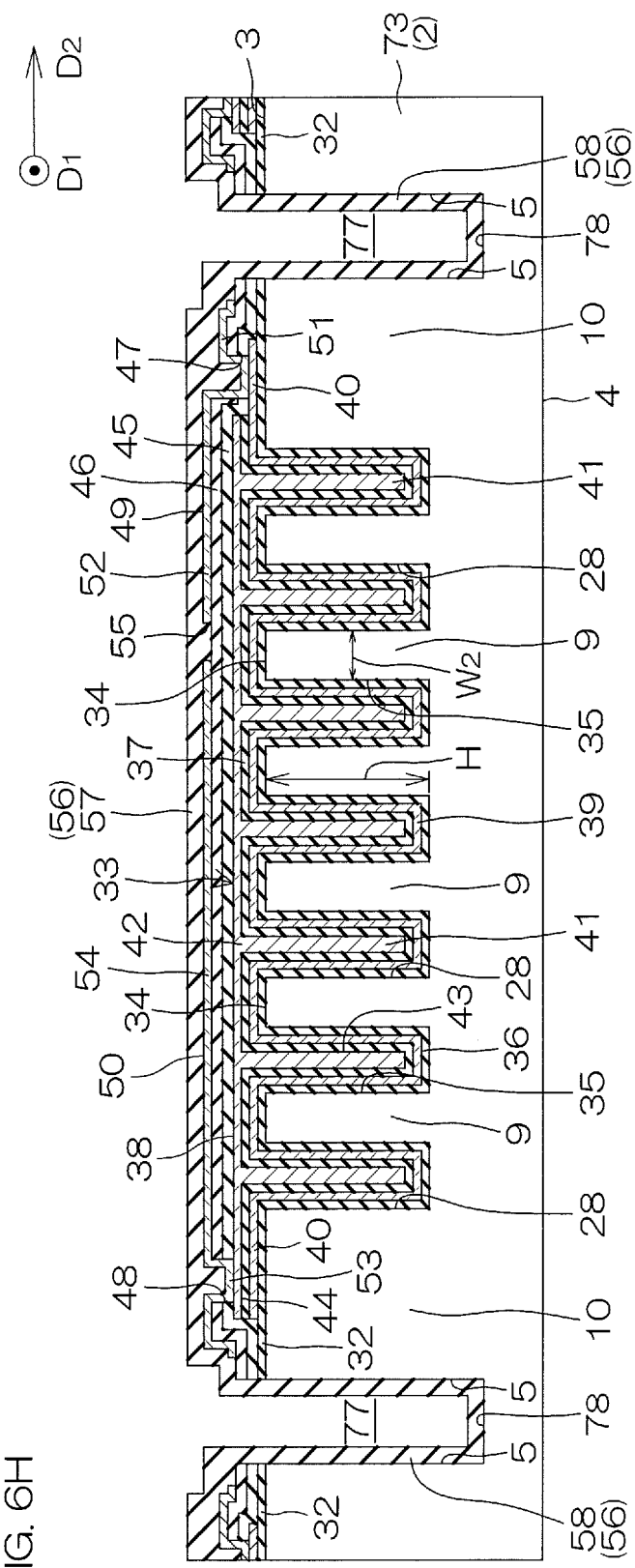

Thereafter, a material for the surface insulating film 56 is formed over the whole area of the first surface 3 of the wafer 73 by, for example, the CVD method as shown in FIG. 6H. At this time, the surface insulating film 56 is also formed in the whole area of an inner surface of the groove 77 (i.e., the third surface 5 and the bottom surface 78).

Figure 6I:
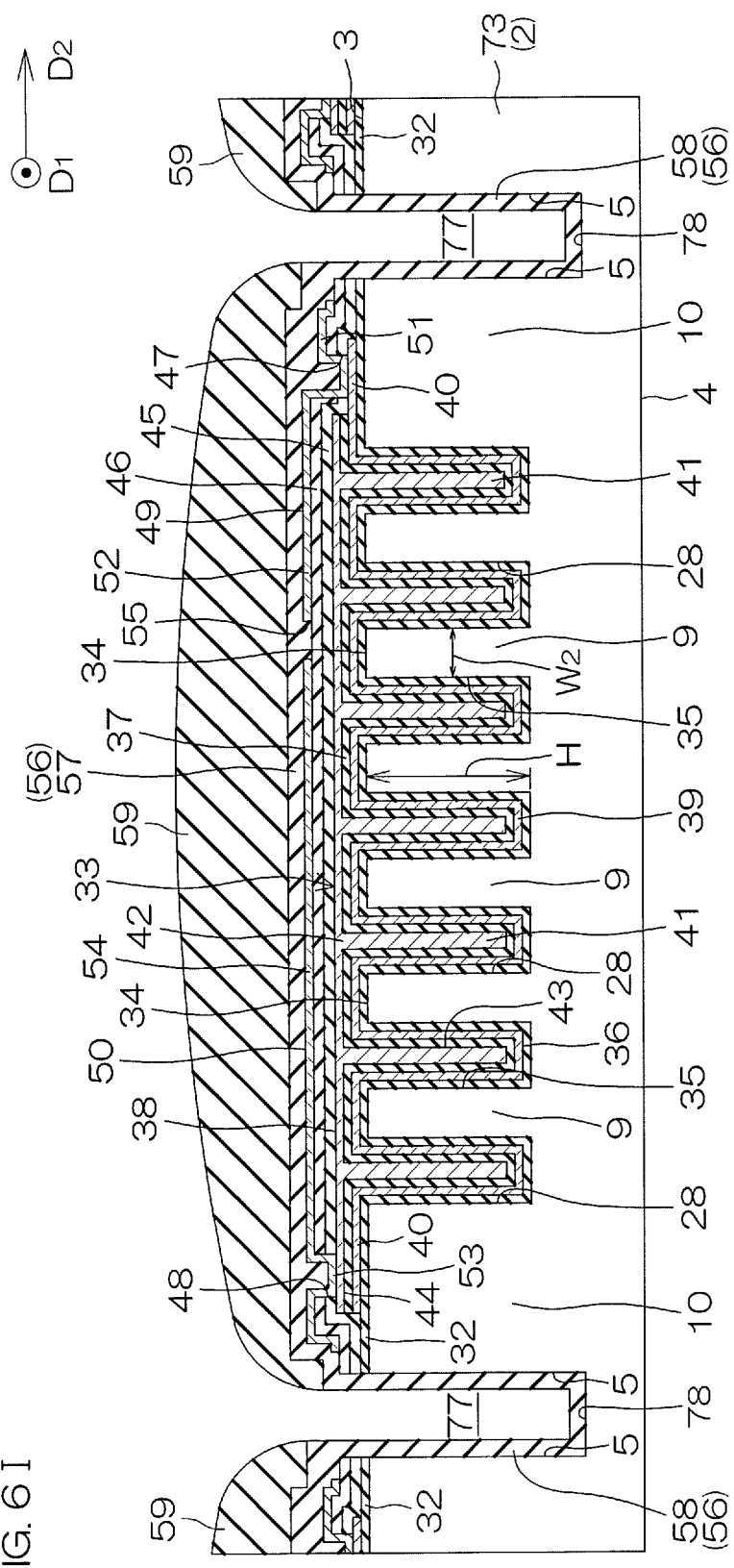

Thereafter, a material for the surface protection film 59 (for example, photosensitive-resin liquid of polyimide) is sprayed and applied onto the wafer 73 from above the surface insulating film 56, and the surface protection film 59 made of photosensitive resin is formed as shown in FIG. 6I. At this time, the liquid is applied onto the wafer 73 through a mask (not shown) that has a pattern with which only the groove 77 is covered in a plan view so that the liquid does not enter the inside of the groove 77. As a result, the liquid photosensitive resin is formed only on the wafer 73, and becomes the surface protection film 59 on the wafer 73.

The surface protection film 59 is not formed in the groove 77 because the liquid does not enter the inside of the groove 77. The surface protection film 59 may be formed by performing the spin application of the liquid or by affixing a sheet made of photosensitive resin to the first surface 3 of the wafer 73 besides the execution of the spray application of the liquid of photosensitive resin.

Thereafter, the surface protection film 59 undergoes heat treatment (cure process). Hence, the thickness of the surface protection film 59 is thermally contracted, and the film quality of the surface protection film 59 is stabilized by hardening the surface protection film 59.

Figure 6J:
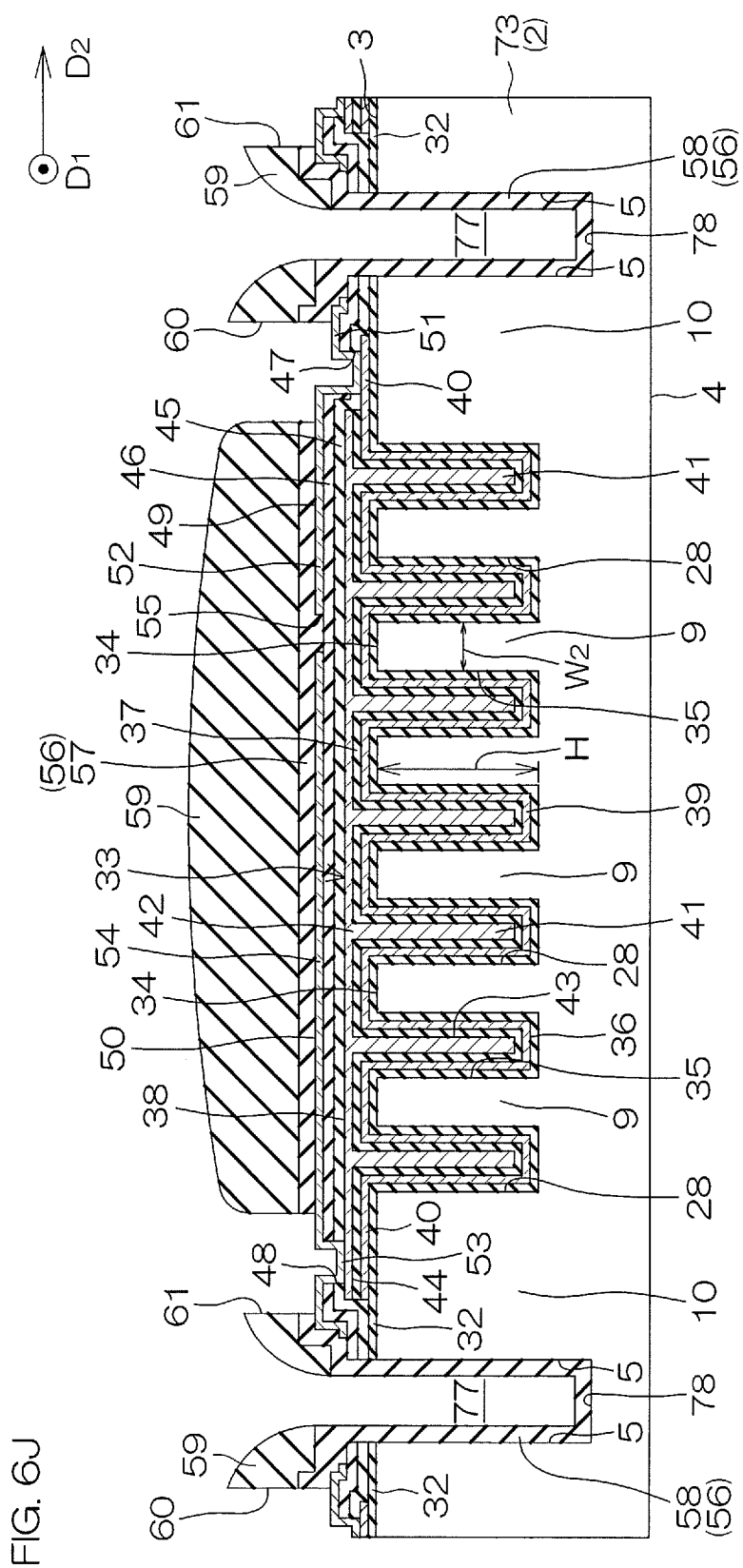

Thereafter, the surface protection film 59 is selectively removed by dry etching, such as RIE (Reactive Ion Etching), through, for example, a photolithography process, and is subjected to patterning as shown in FIG. 6J. Hence, the first pad opening 60 and the second pad opening 61 are simultaneously formed.

Figure 6K:
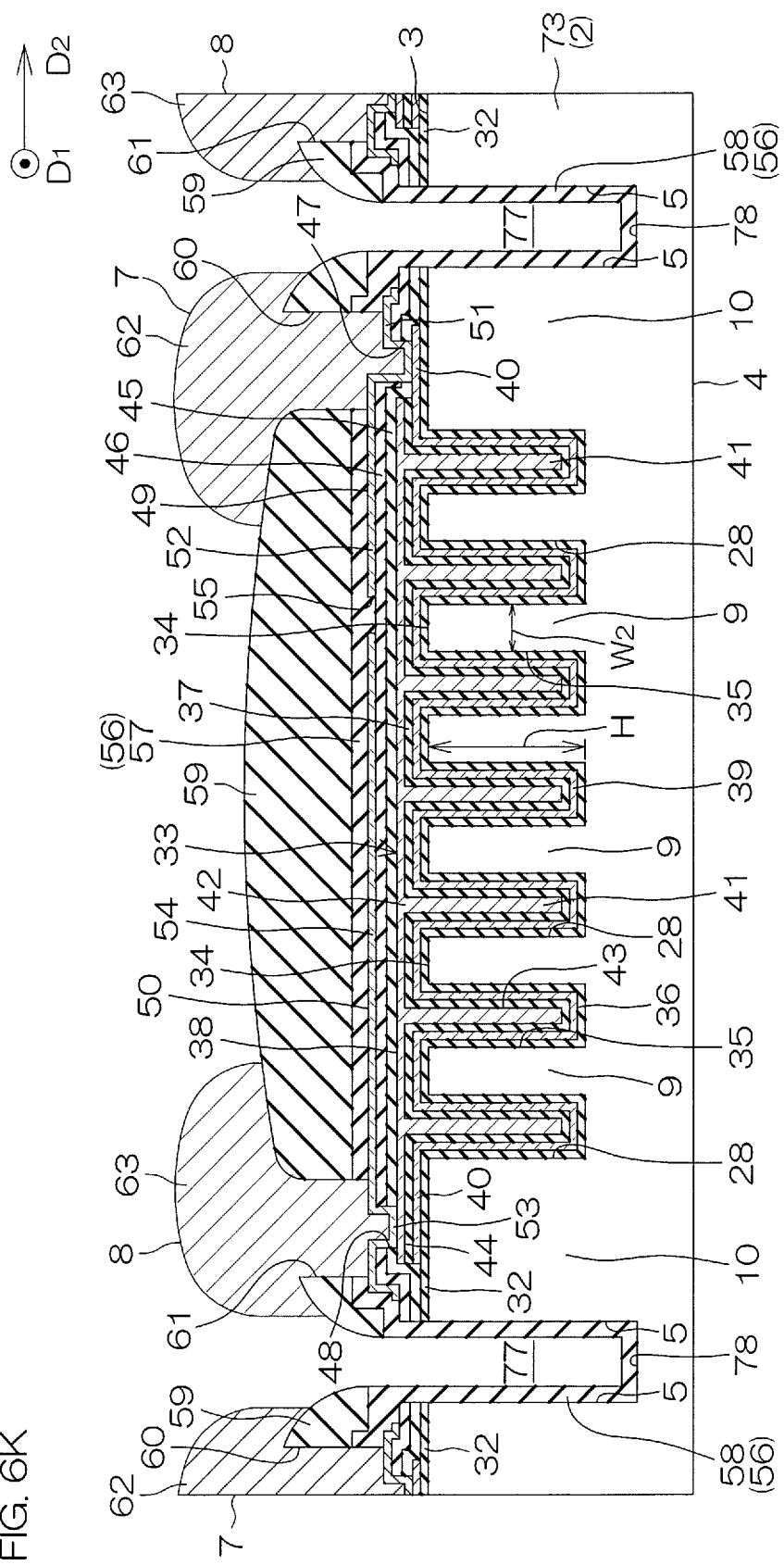

Thereafter, the first external electrode 7 and the second external electrode 8 are simultaneously formed by stacking Ni, Pd, and Au together according to, for example, electroless plating as shown in FIG. 6K.

Figure 6L:
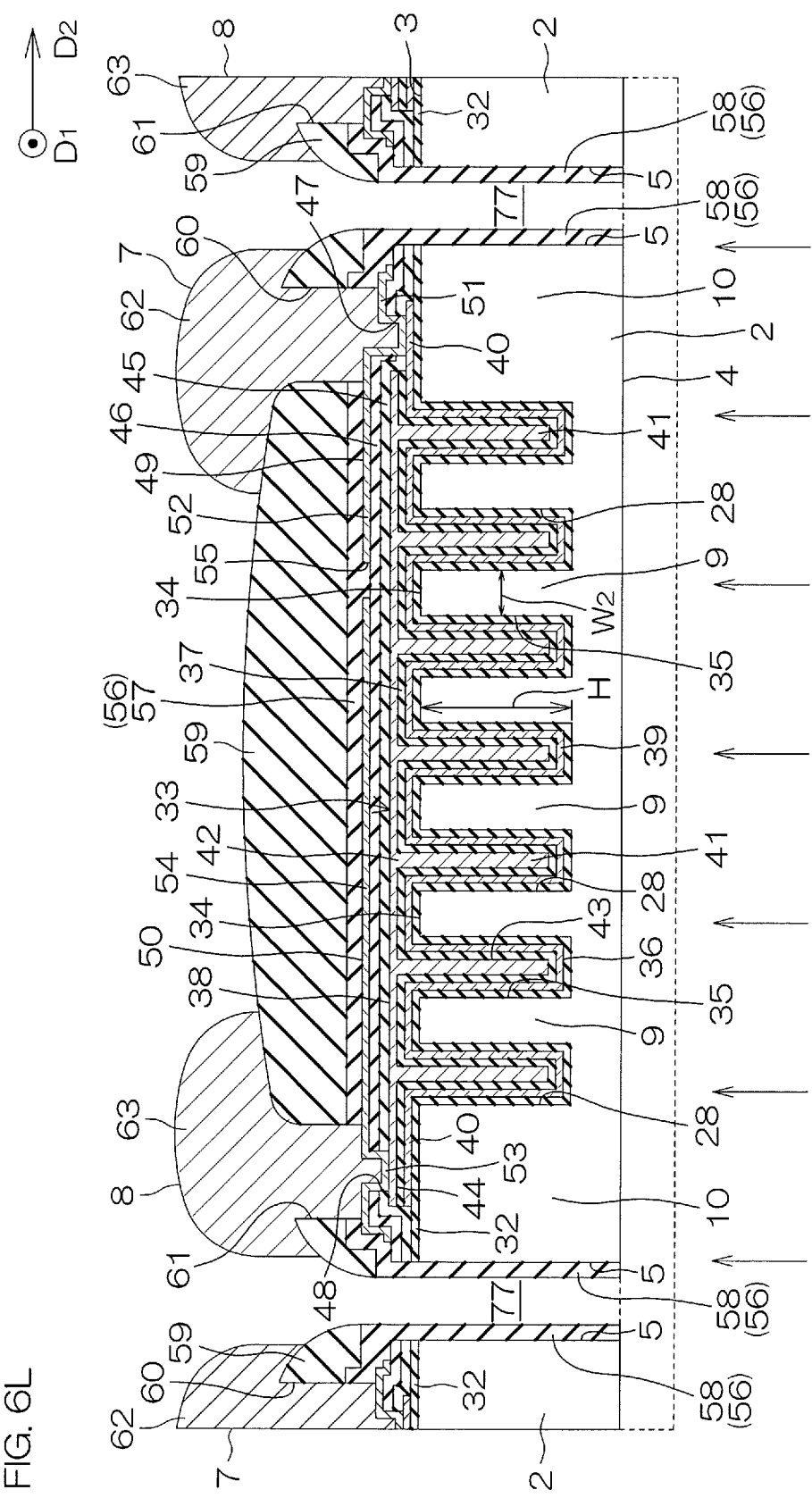

Thereafter, the wafer 73 is ground from the second surface 4 as shown in FIG. 6L. In detail, after the groove 77 is formed, a thin-plate-shaped support tape (not shown) that is made of, for example, PET (polyethylene terephthalate) and that has an adhesive surface is adhered to the first-external-electrode-7 side and the second-external-electrode-8 side (i.e., the first surface 3). Thereafter, the wafer 73 is ground from the second-surface-4 side in a state in which the wafer 73 has been supported by the support tape. When the wafer 73 is thinned by being ground until it reaches the bottom surface 78 of the groove 77, an object by which mutually-adjoining chip components 1 are connected together disappears, and therefore the wafer 73 is divided while the groove 77 serves as a boundary, and the chip component 1 is realized as a finished product. In other words, the wafer 73 is cut (separated) in the groove 77 (i.e., in a boundary region), and, as a result, individual chip components 1 are cut out. It is allowable to cut out chip components 1 by etching the wafer 73 from the second-surface-4 side to the bottom surface 78 of the groove 77.

The second surface 4 may be cleaned by polishing or etching the second surface 4 of the substrate 2 in a finished chip component 1 so as to make a mirror-like surface.

Second Preferred Embodiment

Figure 7:
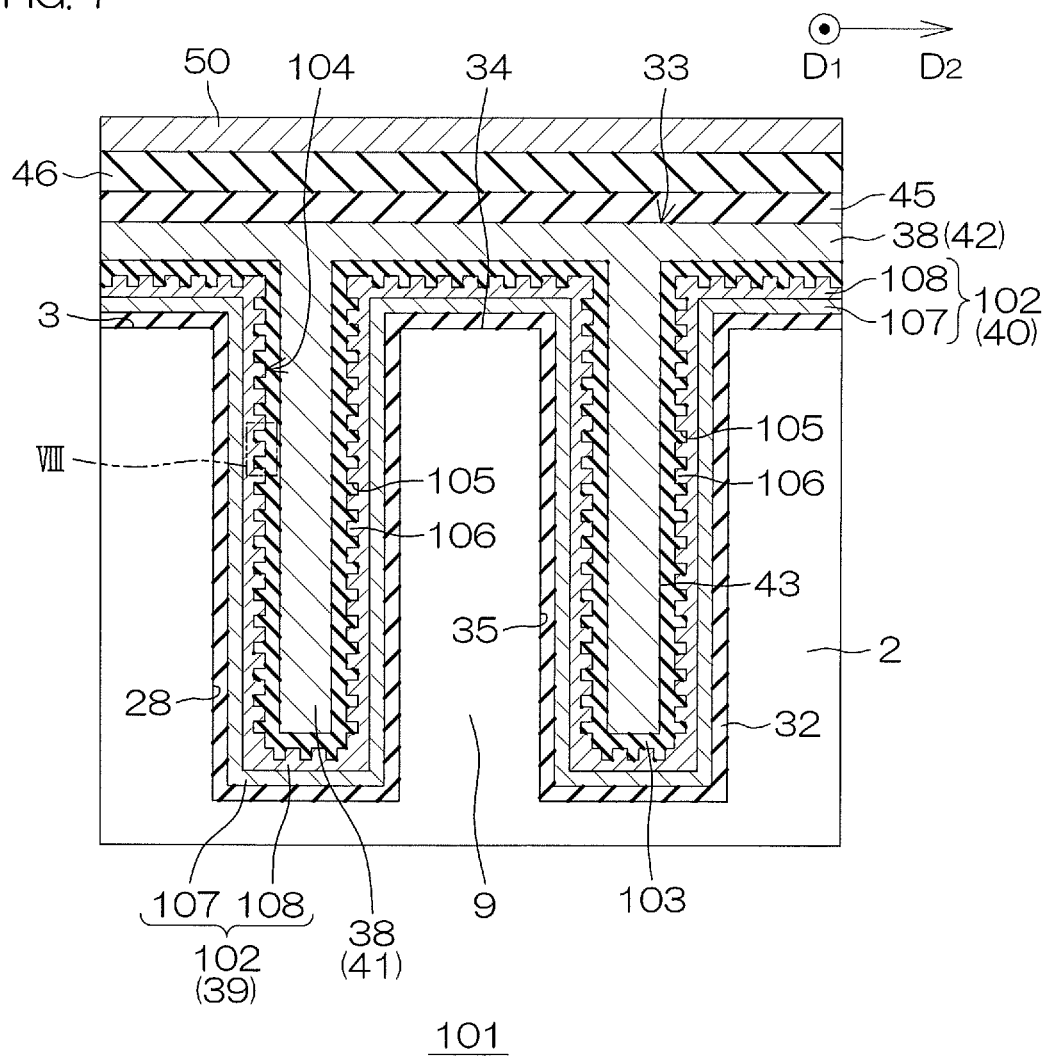
FIG. 7 is an enlarged view of a main portion of a chip component according to a second preferred embodiment of the present invention.

FIG. 7 is an enlarged view of a main portion of a chip component 101 according to a second preferred embodiment of the present invention. In the second preferred embodiment, the same reference sign as in FIG. 1 to FIG. 5 is given to a component that is equivalent to each component of the first preferred embodiment mentioned above, and a description of this component is omitted.

As shown in FIG. 7, the chip component 101 includes a lower electrode 102 and a capacity film 103 instead of the lower electrode 36 and the capacity film 37 mentioned above, respectively. The lower electrode 102 is formed on the insulating film 32, and the capacity film 103 is formed on the lower electrode 102. The upper electrode 38 mentioned above is formed on the capacity film 103.

The lower electrode 102 has an uneven structure 104 at a contact surface with the capacity film 103. The uneven structure 104 is formed over the entirety of the contact surface with the capacity film 103 as shown in FIG. 7. The uneven structure 104 may be formed by alternately repeating the concave portion 105 and the convex portion 106 along the upper surface 34 and the lateral surface 35 of the wall portion 9.

The lower electrode 102 may be composed of a first layer 107 that is contiguous to the insulating film 32 and a second layer 108 that is formed on the first layer 107 and that is contiguous to the capacity film 103. The uneven structure 104 may be formed up to a halfway position in the thickness direction of the second layer 108 as shown in FIG. 7. In other words, the first layer 107 may be formed such that both one surface and the other surface are each formed in a flat film shape, and the second layer 108 may be formed in a film shape in which one surface (surface contiguous to the first layer 107) is flat whereas the other surface (surface contiguous to the capacity film 103) has the uneven structure 104.

The first layer 107 may be made of a semiconductor material, such as polysilicon, or may be made of a metallic material including Cu or Al. If it is a metallic material, the first layer 107 may be made of, for example, Cu, Al, AlSi, or AlCu. The thickness of the first layer 107 may be, for example, 1000 Å to 10000 Å (100 nm to 1000 nm).

The second layer 108 may be made of a semiconductor material, such as polysilicon, or may be made of a metallic material including Cu or Al. If it is a metallic material, the second layer 108 may be made of, for example, Cu, Al, AlSi, or AlCu. Preferably, the second layer 108 is amorphous polysilicon particularly if the uneven structure 104 is the structure shown in FIG. 8. The thickness of the second layer 108 may be, for example, 10 Å to 1000 Å (1 nm to 100 nm).

Figure 8:
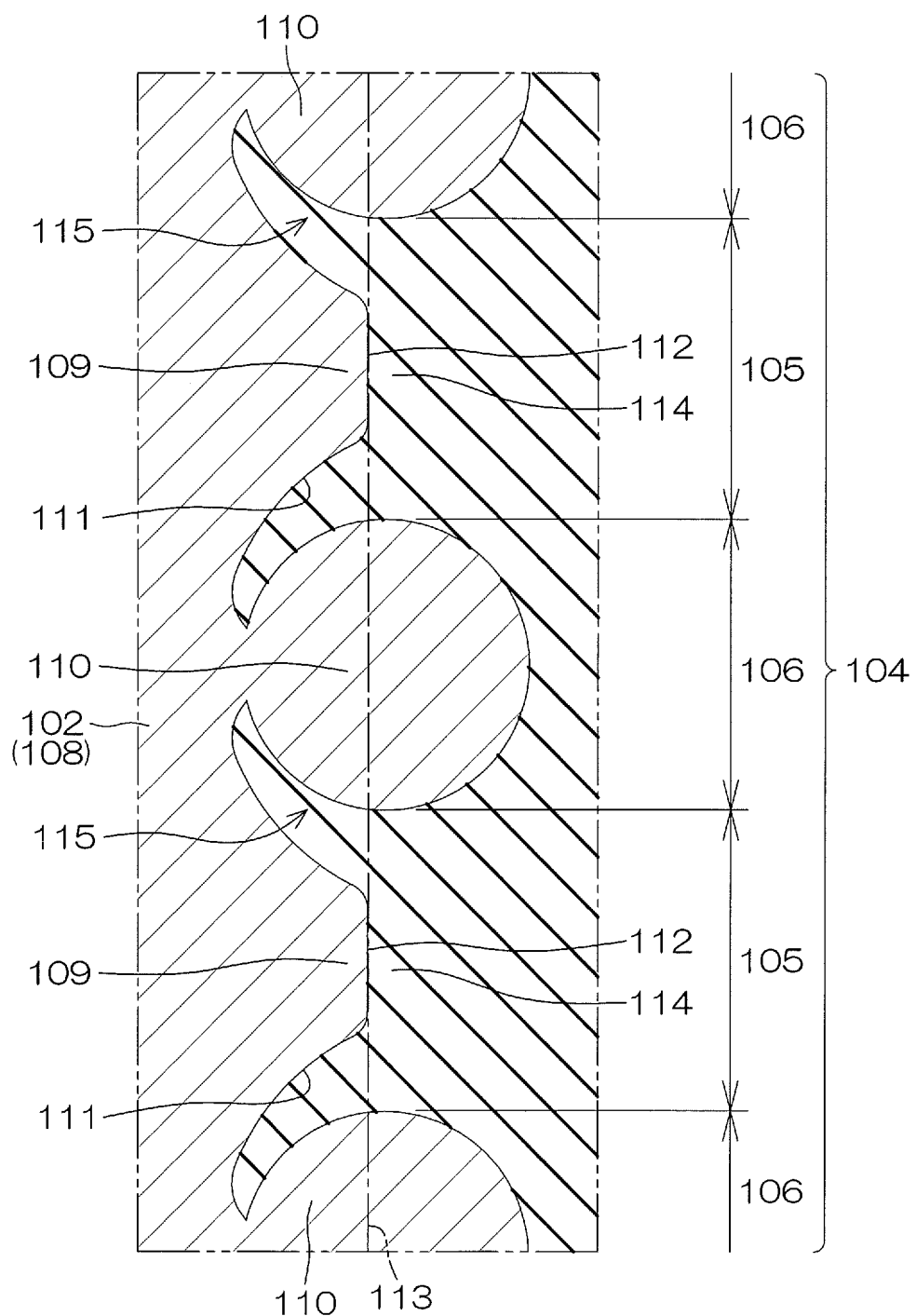
FIG. 8 is an enlarged view of a portion surrounded by the alternate long and two short dashed line VIII of FIG. 7.

FIG. 8 is an enlarged view of a portion surrounded by the alternate long and two short dashed line VIII of FIG. 7. Next, a concrete example of the uneven structure 104 will be described with reference to FIG. 8. It should be noted that the uneven structure 104 is not limited to the structure shown in FIG. 8.

Referring to FIG. 8, the lower electrode 102 (in the present preferred embodiment, the second layer 108) has a plurality of convex portions 109 that have a mountain shape and that are formed with intervals between the convex portions 109 and a spherical portion 110 formed at a concave portion 111 between the mutually-adjoining convex portions 109.

The convex portion 109 may have a top portion 112 placed at a halfway position in the height direction of the spherical portion 110 (in the thickness direction of the lower electrode 102). The top portion 112 may be a flat surface as shown in FIG. 8, or may be a pointed portion. A base surface 113 of the lower electrode 102 is formed by continuously connecting the top portions 112 of the convex portions 109 together as shown by the alternate long and short dashed line in FIG. 8.

The spherical portion 110 is disposed at each of the concave portions 111 between the mutually-adjoining convex portions 109 one by one, and is formed integrally with a bottom portion of the concave portion 111. Although the spherical portion 110 is shown in a precisely circular shape in a cross-sectional view in FIG. 8, the spherical portion 110 may be formed in, for example, a mushroom shape that extends from the bottom portion of each of the concave portions 111 under formation conditions of the spherical portion 110. In this case, it may be referred to as an extension portion, instead of the spherical portion 110, that extends from the concave portion 111. The spherical portion 110 is formed with a size that protrudes outwardly from each of the concave portions 111. In the present preferred embodiment, a hemispherical part of about an upper half of the spherical portion 110 protrudes more outwardly than the base surface 113.

Hence, the uneven structure 104 that includes the hemispherical convex portion 106 protruding from the base surface 113 and the concave portion 105 surrounded by the mutually-adjoining convex portions 106 and by the top portion 112 of the convex portion 109 is formed at the contact surface with the capacity film 103 of the lower electrode 102 (second layer 108). The lower electrode 102 (second layer 108) having the thus formed uneven structure 104 may be referred to as, for example, a hemi-spherical-grained silicon layer.

The capacity film 103 has a convex portion 114 that enters the concave portion 105 of the uneven structure 104 in the present preferred embodiment. The convex portion 114 may enter the concave portion 105 and enter a gap portion 115 between the spherical portion 110 and the concave portion 111.

As described above, according to the chip component 101 of the second preferred embodiment, the uneven structure 104 is formed in the lower electrode 102, and therefore it is possible to increase the surface area of the lower electrode 102. As a result, it is possible to allow the lower electrode 102 to face the upper electrode 38 in a wide area, and it is possible to further enlarge the capacity of the capacitor portion 33.

FIG. 9A to FIG. 9F are views each of which shows part of a process of manufacturing the chip component 101 according to the second preferred embodiment of the present invention.

To manufacture the chip component 101, the gap 28 is formed in the wafer 73 as shown in FIG. 6A and FIG. 6B mentioned above, and the wall portion 9 and the support portion 10 (not shown) are formed in parts excluding the gap 28.

Figure 9A:
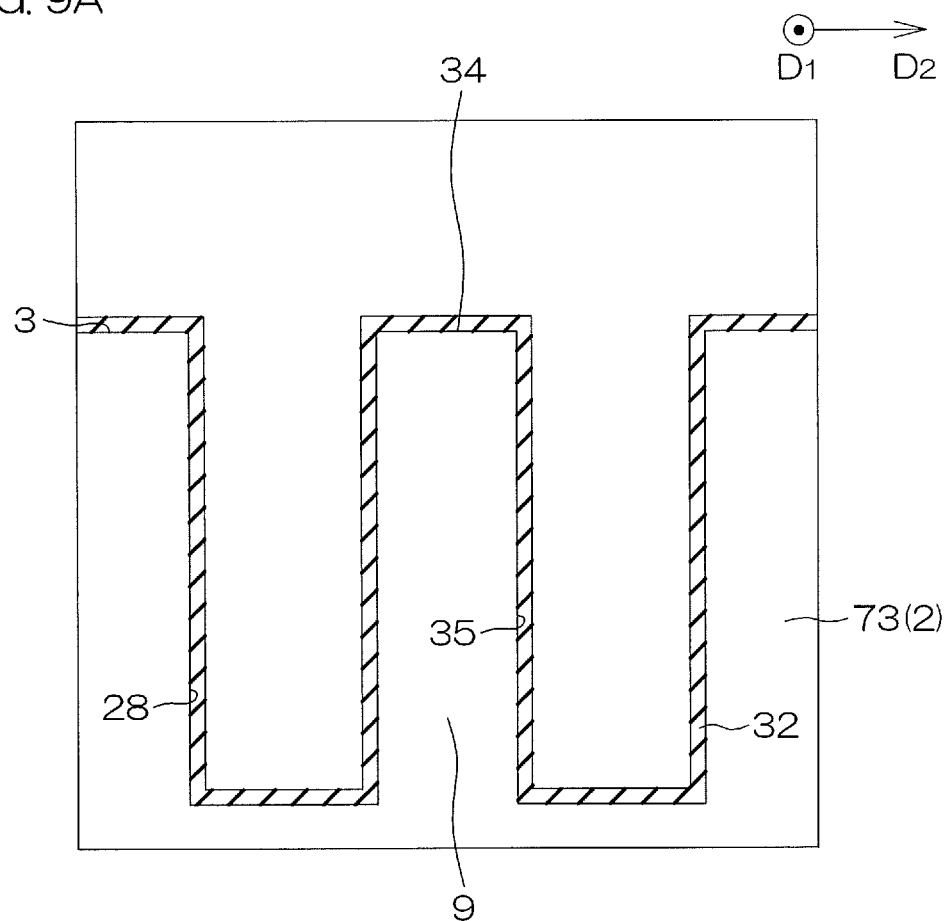
FIG. 9A to FIG. 9F are views each of which shows part of a process of manufacturing the chip component according to the second preferred embodiment of the present invention.

Thereafter, the first surface 3 of the wafer 73 and the upper surface 34 and the lateral surface 35 of the wall portion 9 are, for example, thermally oxidized, and, as a result, the insulating film 32 made of $SiO_2$ is formed as shown in FIG. 9A.

Figure 9B:
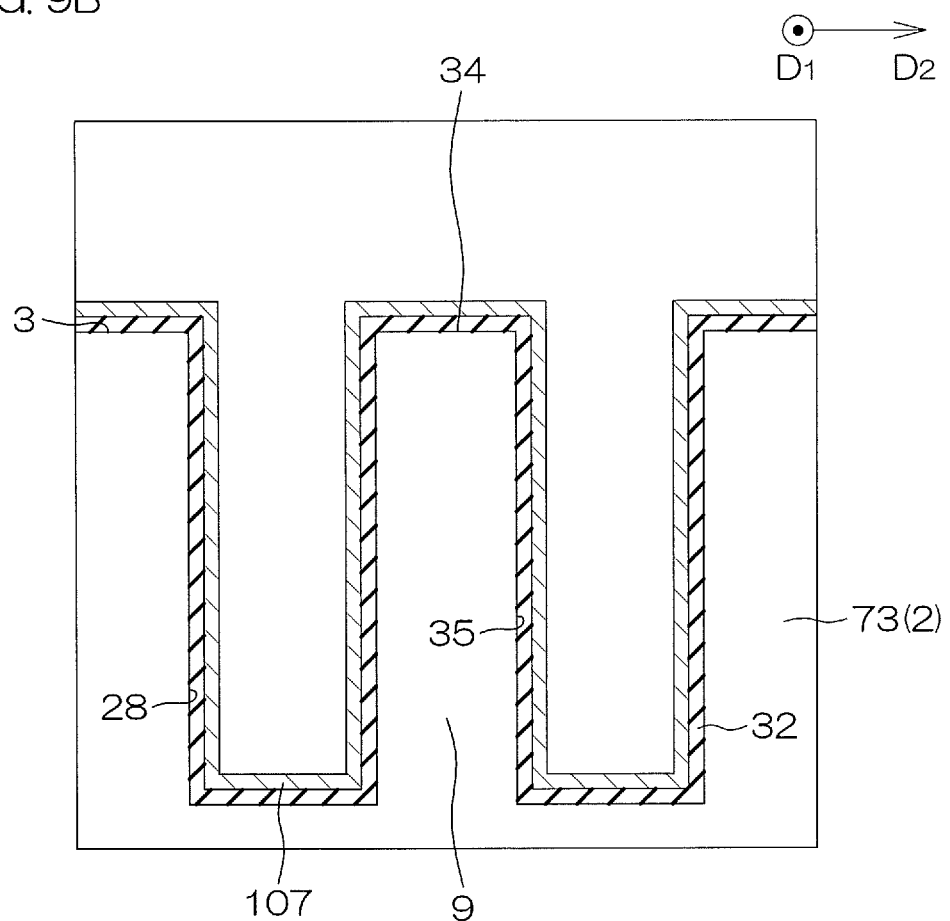

Thereafter, the first layer 107 of the lower electrode 102 is formed by, for example, the CVD method as shown in FIG. 9B.

Figure 9C:
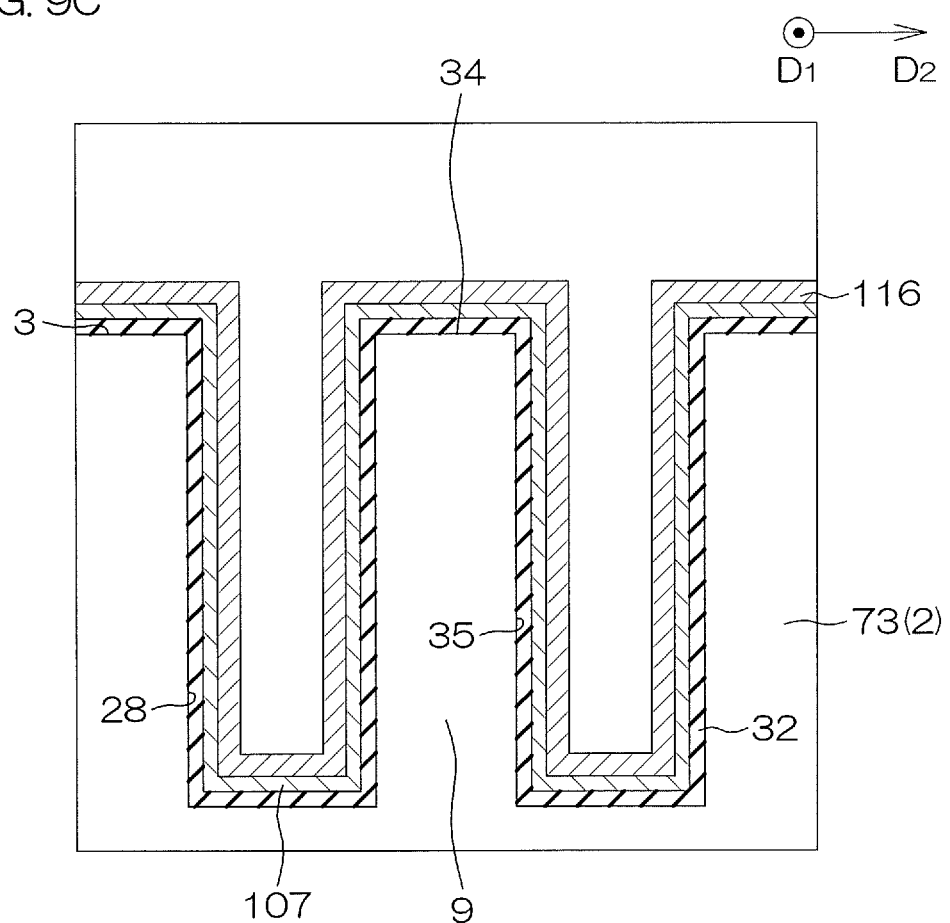
Figure 9D:
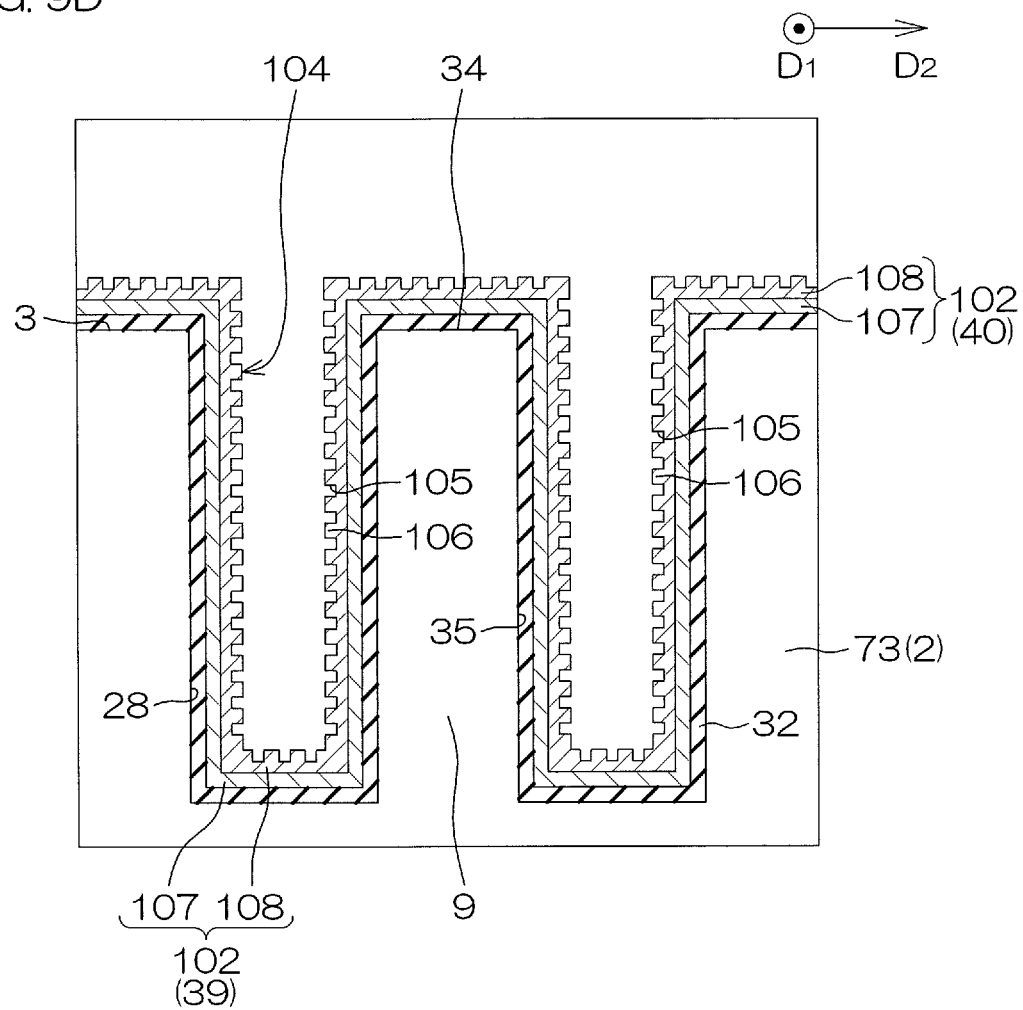

Thereafter, the second layer 108 of the lower electrode 102 having the uneven structure 104 is formed as shown in FIG. 9C and FIG. 9D. The second layer 108 can be formed by, for example, the following procedure. First, an amorphous silicon layer 116 is formed by an LPCVD method using a $Si_2H_6$ gas as shown in FIG. 9C. The amorphous silicon layer 116 may have a thickness of, for example, 800 Å to 1200 Å (80 nm to 120 nm). Thereafter, a surface of the amorphous silicon layer 116 is treated by a hydrofluoric acid (HF) aqueous solution, and, as a result, a natural oxide film formed on the surface of the amorphous silicon layer 116 is removed. Thereafter, Si atoms reach crystal growth on the surface of the amorphous silicon layer 116 through annealing treatment, and the uneven structure 104 shown in FIG. 9D and FIG. 8 is formed.

Figure 9E:
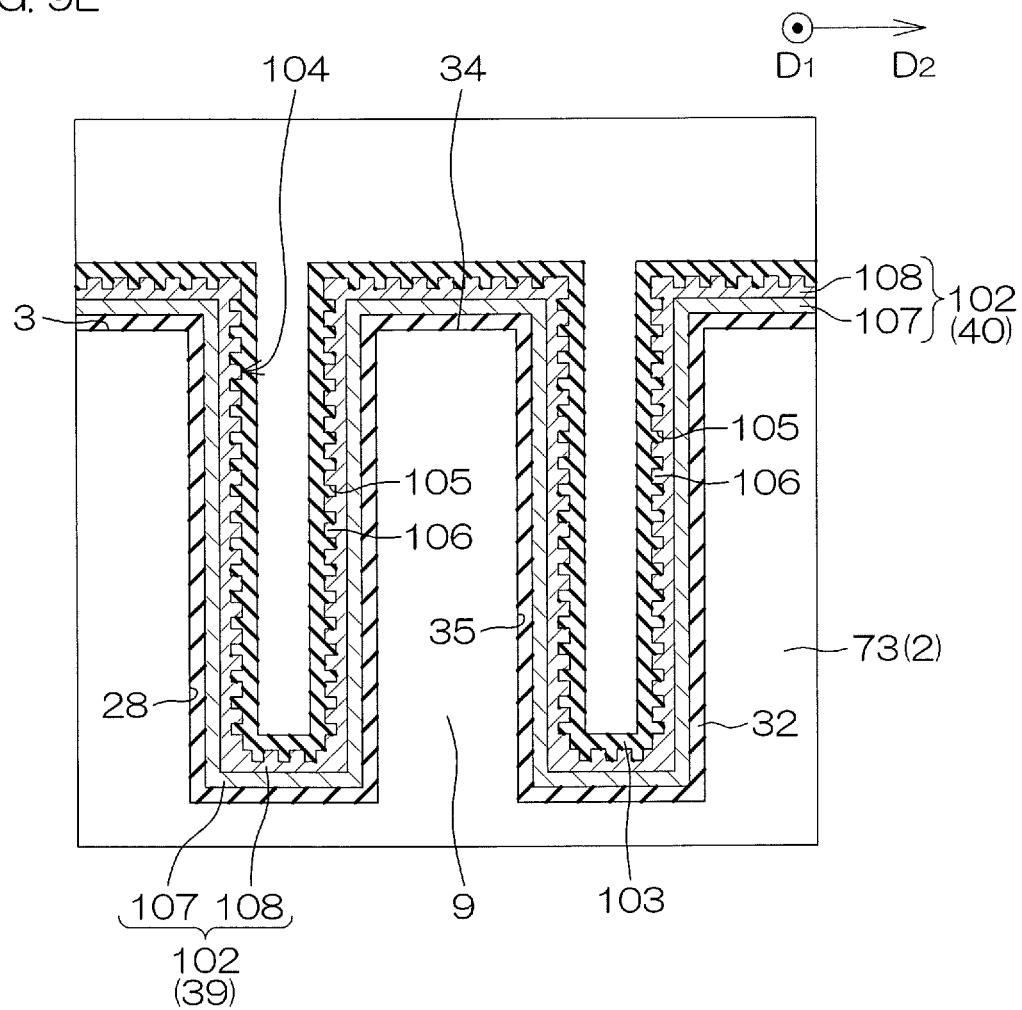
Figure 9F:
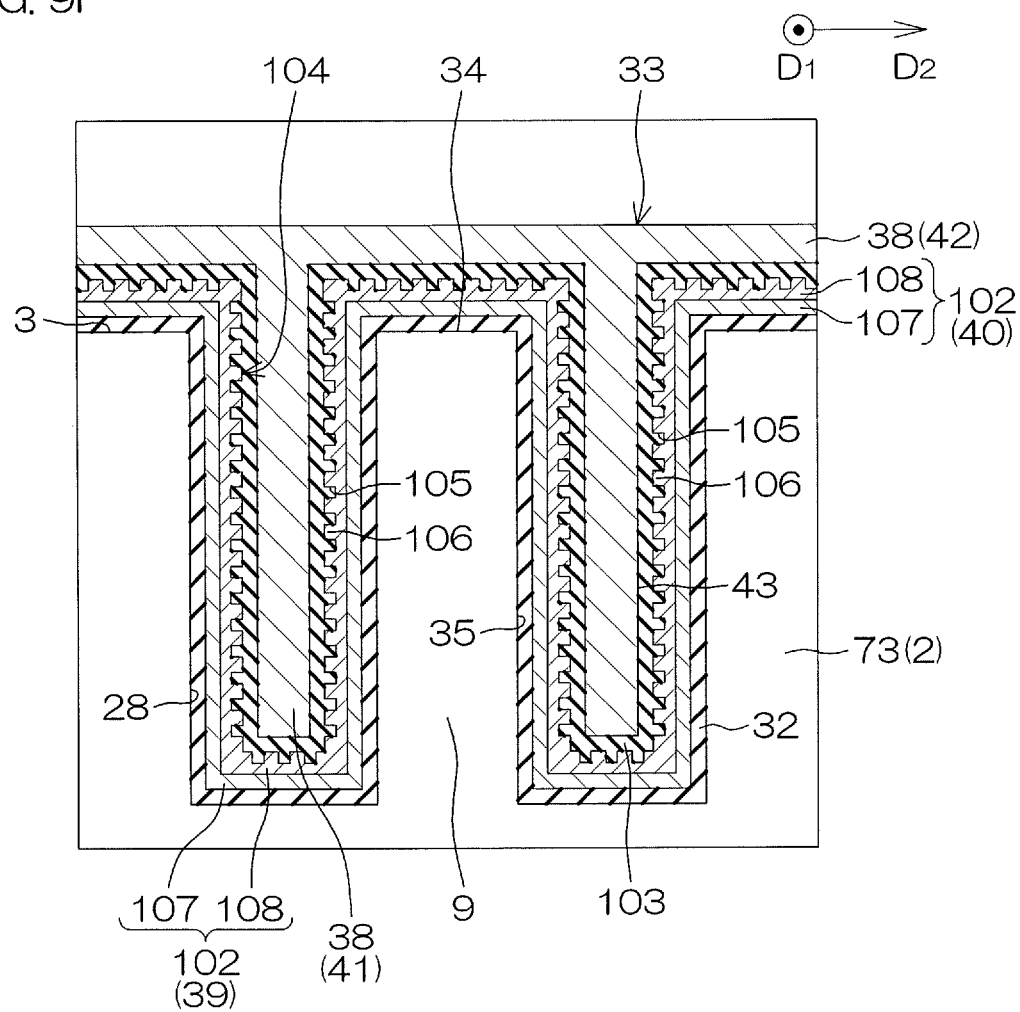

Thereafter, the capacity film 103 and the upper electrode 38 are formed in this order by, for example, the CVD method as shown in FIG. 9E and FIG. 9F.

Thereafter, the chip component 101 is obtained through process steps shown in FIG. 6D to FIG. 6L.

Although the preferred embodiments of the present invention have been described as above, the present invention can be embodied by other modes.

For example, although the capacitor portion 33 has a structure formed of the lower electrode 36 and the upper electrode 38 between which the single capacity film 37 is sandwiched as described in the above preferred embodiment, the structure may include two or more capacity films and electrodes between which each of the capacity films is sandwiched. The size of the wall portion 9 and the size of the gap 28 may be appropriately adjusted by the number of capacity films and the number of electrodes.

Additionally, the lower electrode 36 is not necessarily required to be a conductive film, and may be a part of the substrate 2. For example, a highly concentrated impurity region (for example, $p^+$ type region) may be formed at the surface portion of the substrate 2 by following the upper surface 34 and the lateral surface 35 of the wall portion 9 as shown in FIG. 10, and this impurity region may be used as a lower electrode 79. In this case, the insulating film 32 can be omitted.

Additionally, although the chip component 1 is a chip capacitor in which a capacitor structure is solely mounted as described in the above preferred embodiment, the chip component 1 may be made as a composite element by setting regions for other elements, such as diode and fuse, in the substrate 2.

Besides, various design changes can be made within the scope of the matters described in the appended claims.

What is claimed is:

1. A chip component comprising:
   a substrate that has a first surface and a second surface on a side opposite to the first surface;
   a plurality of wall portions that are formed on a side of the first surface by using a part of the substrate, that have one end portion and one other end portion, and that are formed of a plurality of pillar units;

a support portion that is formed around the wall portions by using a part of the substrate and that is connected to at least one of the end portion and the other end portion of the wall portions; and a capacitor portion formed by following a surface of the wall portions, wherein each of the pillar units includes a central portion and three convex portions that extend from the central portion in three mutually different directions in a plan view, and each of the wall portions has a first end and a second end joined to the support portion in a longitudinal direction of each wall portion, and is formed by a physical connection between the adjoining convex portions of the pillar units, and the plurality of pillar units are continuously physically connected from the first end of each wall portion to the second end of each wall portion.

2. The chip component according to claim 1, wherein, in each of the pillar units, each of the convex portions makes an angle of 120° with an adjoining convex portion that is one of the convex portions, and each of the convex portions intersects the adjoining convex portion at the central portion.

3. The chip component according to claim 1, wherein a first wall portion that is one of a plurality of the wall portions includes a first main portion that extends in a first direction and that is connected to the support portion and first branch portions that extend in a second direction intersecting the first direction and that are disposed in a comb-teeth manner along the first direction, and each of the first branch portions is formed by a first convex portion among the convex portions of each of the pillar units of the first wall portion.

4. The chip component according to claim 3, wherein the convex portions of each of the pillar units of the first wall portion include a second convex portion and a third convex portion excluding the first convex portion, and the first main portion is formed by a connection between the second convex portion and the third convex portion of the pillar units that adjoin each other.

5. The chip component according to claim 3, wherein a plurality of the wall portions include a second wall portion that adjoins the first wall portion, and the second wall portion includes a second main portion that extends in the first direction and that is connected to the support portion and comb-teeth-shaped second branch portions that extend toward the first main portion and that are each engaged with the comb-teeth-shaped first branch portion, and each of the second branch portions is formed by a fourth convex portion among the convex portions of each of the pillar units of the second wall portion.

6. The chip component according to claim 5, wherein the convex portions of each of the pillar units of the second wall portion include a fifth convex portion and a sixth convex portion excluding the fourth convex portion, and the second main portion is formed by a connection between the fifth convex portion and the sixth convex portion of the pillar units that adjoin each other.

7. The chip component according to claim 1, wherein a ratio (W/H) of a width W of each of the convex portions of the pillar units with respect to a height H of the wall portion is 2/50 to 2/100.

8. The chip component according to claim 1, wherein the support portion is formed in an annular shape surrounding the plurality of wall portions.

9. The chip component according to claim 1, further comprising an insulating film formed on a surface of the wall portions, wherein the capacitor portion includes a lower electrode formed on the insulating film, a capacity film formed on the lower electrode, and an upper electrode formed on the capacity film.

10. The chip component according to claim 9, wherein the upper electrode includes an embedded electrode that is embedded in a space between wall portions that adjoin each other.

11. The chip component according to claim 9, wherein the lower electrode and the upper electrode include a polysilicon electrode, and the capacity film includes an oxide film.

12. The chip component according to claim 9, further comprising:

a first electrode film that is formed on the substrate and that is electrically connected to the lower electrode;

a second electrode film that is formed on the substrate and that is electrically connected to the upper electrode;

a surface insulating film with which the first electrode film and the second electrode film are covered;

a first external electrode that is formed on the surface insulating film and that is electrically connected to the first electrode film while passing through the surface insulating film; and a second external electrode that is formed on the surface insulating film and that is electrically connected to the second electrode film while passing through the surface insulating film.

13. The chip component according to claim 12, wherein the first electrode film is connected to the lower electrode in a region directly under the first external electrode.

14. The chip component according to claim 12, wherein the second electrode film is connected to the upper electrode in a region directly under the second external electrode.

15. The chip component according to claim 12, wherein the first electrode film and the second electrode film include an aluminum electrode film.

16. The chip component according to claim 12, wherein the first external electrode and the second external electrode include a plated layer formed by plating growth.

17. The chip component according to claim 12, wherein the wall portion is formed in a region between the first external electrode and the second external electrode and in a region directly under both the first external electrode and the second external electrode.

18. The chip component according to claim 9, wherein the lower electrode has an uneven structure at a contact surface with the capacity film.

19. The chip component according to claim 1, wherein the substrate includes a semiconductor substrate.

* * * * *